United States Patent
Stuart et al.

(10) Patent No.: US 10,602,082 B2
(45) Date of Patent: Mar. 24, 2020

(54) TRIGGERED OPERATION AND/OR RECORDING OF TEST AND MEASUREMENT OR IMAGING TOOLS

(71) Applicant: Fluke Corporation, Everett, WA (US)

(72) Inventors: Michael D. Stuart, Issaquah, WA (US); Paul H. Heydron, Everett, WA (US); Joseph V. Ferrante, Richmond, WA (US); Michael A. Schoch, Granite Falls, WA (US); Hilton G. Hammond, Bothell, WA (US)

(73) Assignee: Fluke Corporation, Everett, WA (US)

( * ) Notice: Subject to any disclaimer, the term of this patent is extended or adjusted under 35 U.S.C. 154(b) by 16 days.

(21) Appl. No.: 14/856,046

(22) Filed: Sep. 16, 2015

(65) Prior Publication Data
US 2016/0080667 A1    Mar. 17, 2016

Related U.S. Application Data

(60) Provisional application No. 62/076,088, filed on Nov. 6, 2014, provisional application No. 62/051,930, filed on Sep. 17, 2014.

(51) Int. Cl.
*H04N 5/33* (2006.01)
*G01R 31/302* (2006.01)
(Continued)

(52) U.S. Cl.
CPC ............ *H04N 5/332* (2013.01); *G01D 21/02* (2013.01); *G01R 31/302* (2013.01); *H04N 5/225* (2013.01); *G01R 13/00* (2013.01)

(58) Field of Classification Search
CPC .... G01D 21/02; G01R 13/00; G01R 13/0236; G01R 15/125; G01R 31/302; H04N 5/225; H04N 5/332
(Continued)

(56) References Cited

U.S. PATENT DOCUMENTS

| 4,467,279 A | 8/1984 | MacCormack |
| 4,954,094 A | 9/1990 | Humphrey |

(Continued)

FOREIGN PATENT DOCUMENTS

| CN | 1548967 A | 11/2004 |
| CN | 101617238 A | 12/2009 |

(Continued)

OTHER PUBLICATIONS

1587 FC/1587/1577 Insulation Multimeter, User's Manual, Apr. 2005, 50 pages.
(Continued)

*Primary Examiner* — Christopher S Kelley
*Assistant Examiner* — Kathleen M Walsh
(74) *Attorney, Agent, or Firm* — Fredrikson & Byron P.A.

(57) ABSTRACT

Systems can include a test and measurement tool configured to generate measurement data, and imaging tool configured to generate image data, and a processor in communication with the imaging tool and the test and measurement tool. The processor can be configured to receive image data from the imaging tool and, if the image data satisfies one or more predetermined conditions, trigger the test and measurement tool to perform one or more corresponding operations. Similarly, the processor can receive measurement data from the test and measurement tool and, if the measurement data satisfies one or more predetermined conditions trigger the imaging tool to perform one or more corresponding operations.

20 Claims, 10 Drawing Sheets

(51) Int. Cl.
 *H04N 5/225* (2006.01)
 *G01D 21/02* (2006.01)
 *G01R 13/00* (2006.01)
(58) Field of Classification Search
 USPC .......................................................... 348/135
 See application file for complete search history.

(56) References Cited

U.S. PATENT DOCUMENTS

| | | | |
|---|---|---|---|
| 5,065,249 A | 11/1991 | Horn et al. | |
| 5,500,786 A | 3/1996 | Ono | |
| 5,844,719 A | 12/1998 | Wada | |
| 6,095,682 A | 8/2000 | Hollander et al. | |
| 7,535,002 B2 * | 5/2009 | Johnson | G01J 5/02 250/332 |
| 7,810,001 B2 | 10/2010 | Zhou et al. | |
| 7,851,758 B1 * | 12/2010 | Scanlon | G01J 5/02 250/330 |
| 7,902,507 B1 * | 3/2011 | Garvey, III | G01J 5/00 250/330 |
| 7,994,480 B2 | 8/2011 | Johnson et al. | |
| 8,003,942 B2 * | 8/2011 | Garvey, III | G01J 5/00 250/330 |
| 8,097,857 B2 * | 1/2012 | Cochran | G01N 21/88 250/358.1 |
| 8,186,873 B1 * | 5/2012 | Madding | G01N 25/18 250/338.1 |
| 8,186,876 B2 | 5/2012 | Mullin et al. | |
| 8,208,026 B2 | 6/2012 | Hogasten et al. | |
| 8,242,445 B1 * | 8/2012 | Scanlon | G01J 5/02 250/330 |
| 8,274,273 B2 | 9/2012 | Nguyen et al. | |
| 8,289,372 B2 | 10/2012 | Hamrelius et al. | |
| 8,374,438 B1 * | 2/2013 | Wagner | H04N 5/33 250/330 |
| 8,520,970 B2 | 8/2013 | Strandemar | |
| 8,620,841 B1 | 12/2013 | Filson et al. | |
| 8,749,635 B2 | 6/2014 | Hogasten et al. | |
| 8,803,698 B1 | 8/2014 | Heydron | |
| 8,822,922 B1 * | 9/2014 | Scanlon | G01J 5/02 250/330 |
| 9,058,653 B1 | 6/2015 | Kostrzewa et al. | |
| 9,143,703 B2 | 9/2015 | Boulanger et al. | |
| 9,235,023 B2 | 1/2016 | Burt et al. | |
| 9,264,154 B1 | 2/2016 | Laun | |
| 9,473,681 B2 | 10/2016 | Hoelter et al. | |
| 9,509,924 B2 | 11/2016 | Terre et al. | |
| 9,716,843 B2 * | 7/2017 | Fox | H04N 5/33 |
| 2002/0001032 A1 | 1/2002 | Ohki | |
| 2002/0038205 A1 | 3/2002 | Gray et al. | |
| 2003/0089183 A1 | 5/2003 | Jacobsen et al. | |
| 2004/0004482 A1 | 1/2004 | Bouabdo et al. | |
| 2004/0030524 A1 | 2/2004 | Jarrell et al. | |
| 2004/0190586 A1 | 9/2004 | Lee | |
| 2005/0107976 A1 | 5/2005 | Klijn et al. | |
| 2005/0188290 A1 | 8/2005 | Motika et al. | |
| 2005/0259715 A1 | 11/2005 | Lee et al. | |
| 2005/0279172 A1 | 12/2005 | Schreier et al. | |
| 2006/0012385 A1 * | 1/2006 | Tsao | G01R 31/302 324/750.14 |
| 2006/0017821 A1 | 1/2006 | Garvey et al. | |
| 2006/0043296 A1 | 3/2006 | Mian et al. | |
| 2006/0046793 A1 | 3/2006 | Hamilton et al. | |
| 2006/0066325 A1 | 3/2006 | McGinnis et al. | |
| 2006/0150724 A1 | 7/2006 | Byrne | |
| 2006/0282736 A1 | 12/2006 | Schroth et al. | |
| 2006/0289772 A1 * | 12/2006 | Johnson | G01C 3/08 250/370.08 |
| 2007/0058164 A1 | 3/2007 | Shibata et al. | |
| 2007/0087311 A1 | 4/2007 | Garvey et al. | |
| 2007/0198226 A1 | 8/2007 | Lee | |
| 2008/0026647 A1 | 1/2008 | Boehnlein et al. | |
| 2008/0091470 A1 | 4/2008 | Muradia | |
| 2008/0099678 A1 * | 5/2008 | Johnson | G01J 5/02 250/332 |
| 2008/0100253 A1 | 5/2008 | Kiyamura | |
| 2008/0204034 A1 | 8/2008 | Blades | |
| 2008/0295582 A1 | 12/2008 | Lee et al. | |
| 2009/0097502 A1 | 4/2009 | Yamamoto | |
| 2009/0141137 A1 | 6/2009 | Watanabe et al. | |
| 2009/0158849 A1 | 6/2009 | Gregg et al. | |
| 2009/0184244 A1 | 7/2009 | Drews et al. | |
| 2009/0294666 A1 * | 12/2009 | Hargel | G01J 5/0014 250/330 |
| 2010/0045809 A1 * | 2/2010 | Packard | H04N 5/2258 348/222.1 |
| 2010/0097057 A1 | 4/2010 | Karpen | |
| 2010/0117885 A1 | 5/2010 | Holbrook et al. | |
| 2010/0130838 A1 | 5/2010 | Kermani et al. | |
| 2010/0148759 A1 | 6/2010 | Lagerberg et al. | |
| 2010/0163730 A1 | 7/2010 | Schmidt et al. | |
| 2010/0164527 A1 | 7/2010 | Weyh et al. | |
| 2010/0225299 A1 | 9/2010 | Nguyen et al. | |
| 2010/0240317 A1 | 9/2010 | Giles et al. | |
| 2011/0018987 A1 | 1/2011 | Doi | |
| 2011/0096148 A1 * | 4/2011 | Stratmann | G01J 5/02 348/46 |
| 2011/0096168 A1 | 4/2011 | Siann et al. | |
| 2011/0112701 A1 | 5/2011 | Johnson et al. | |
| 2011/0122251 A1 | 5/2011 | Schmidt | |
| 2011/0154999 A1 | 6/2011 | Schoch | |
| 2011/0185048 A1 | 7/2011 | Yew et al. | |
| 2011/0239794 A1 | 10/2011 | Krapf et al. | |
| 2011/0273556 A1 | 11/2011 | Lyons et al. | |
| 2012/0001768 A1 | 1/2012 | Radosavljevic et al. | |
| 2012/0019281 A1 | 1/2012 | Barbour, II | |
| 2012/0038458 A1 * | 2/2012 | Toepke | G05B 19/042 340/6.1 |
| 2012/0038760 A1 * | 2/2012 | Kantzes | G05B 19/042 348/61 |
| 2012/0154172 A1 * | 6/2012 | O'Hara | H04Q 9/00 340/870.02 |
| 2012/0206129 A1 | 8/2012 | Mahan et al. | |
| 2012/0244290 A1 | 9/2012 | Mullin et al. | |
| 2012/0276867 A1 | 11/2012 | McNamee et al. | |
| 2012/0314086 A1 * | 12/2012 | Hubel | H04N 17/002 348/175 |
| 2012/0320189 A1 | 12/2012 | Stuart et al. | |
| 2013/0006570 A1 | 1/2013 | Kaplan | |
| 2013/0010287 A1 | 1/2013 | Tutton et al. | |
| 2013/0028477 A1 * | 1/2013 | Schmieder | H04N 5/145 382/103 |
| 2013/0057713 A1 | 3/2013 | Khawand | |
| 2013/0078908 A1 | 3/2013 | Smith | |
| 2013/0155249 A1 | 6/2013 | Neeley et al. | |
| 2013/0155474 A1 | 6/2013 | Roach et al. | |
| 2013/0162835 A1 | 6/2013 | Forland et al. | |
| 2013/0169799 A1 | 7/2013 | Hoelzl et al. | |
| 2013/0176418 A1 * | 7/2013 | Pandey | G01N 25/72 348/83 |
| 2013/0188058 A1 * | 7/2013 | Nguyen | G01J 5/02 348/164 |
| 2013/0250102 A1 | 9/2013 | Scanlon et al. | |
| 2013/0253551 A1 | 9/2013 | Boyle et al. | |
| 2013/0278264 A1 | 10/2013 | Boskamp | |
| 2013/0278771 A1 | 10/2013 | Magoun et al. | |
| 2013/0286408 A1 | 10/2013 | Castillo et al. | |
| 2013/0321621 A1 | 12/2013 | Menzel | |
| 2013/0321641 A1 | 12/2013 | McManus et al. | |
| 2013/0342680 A1 | 12/2013 | Zeng et al. | |
| 2014/0002639 A1 * | 1/2014 | Cheben | G08B 21/14 348/135 |
| 2014/0036068 A1 * | 2/2014 | Nguyen | G01J 5/12 348/135 |
| 2014/0042319 A1 | 2/2014 | Pickett et al. | |
| 2014/0058797 A1 | 2/2014 | Roy et al. | |
| 2014/0062496 A1 | 3/2014 | Kwon et al. | |
| 2014/0085459 A1 * | 3/2014 | Blanton | H04N 17/04 348/135 |
| 2014/0104415 A1 | 4/2014 | Fox et al. | |
| 2014/0119213 A1 | 5/2014 | Devarasetty | |

(56) References Cited

U.S. PATENT DOCUMENTS

| | | | |
|---|---|---|---|
| 2014/0176725 A1 | 6/2014 | Stuart et al. | |
| 2014/0184810 A1* | 7/2014 | Sekiguchi | H01L 27/1461 348/164 |
| 2014/0219314 A1* | 8/2014 | Ryou | G01J 5/0859 374/152 |
| 2014/0253735 A1 | 9/2014 | Fox et al. | |
| 2014/0266765 A1 | 9/2014 | Neeley et al. | |
| 2014/0267753 A1 | 9/2014 | Epperson et al. | |
| 2014/0267757 A1 | 9/2014 | Abramson et al. | |
| 2014/0270546 A1 | 9/2014 | Neeley et al. | |
| 2014/0278259 A1 | 9/2014 | Neeley et al. | |
| 2014/0313325 A1 | 10/2014 | Buehler et al. | |
| 2014/0327735 A1 | 11/2014 | Ruchet et al. | |
| 2015/0054492 A1 | 2/2015 | Mende et al. | |
| 2015/0063652 A1 | 3/2015 | Mangan et al. | |
| 2015/0170110 A1 | 6/2015 | Schluessel et al. | |
| 2015/0185251 A1 | 7/2015 | Heydron et al. | |
| 2015/0205135 A1 | 7/2015 | Border et al. | |
| 2015/0269742 A1 | 9/2015 | Bergstrom et al. | |
| 2015/0334225 A1 | 11/2015 | Bull et al. | |
| 2015/0365598 A1 | 12/2015 | Tanaka et al. | |
| 2015/0369730 A1 | 12/2015 | Schmidt et al. | |
| 2016/0025799 A1* | 1/2016 | Stolper | G01R 31/1218 702/58 |
| 2016/0105810 A1 | 4/2016 | Khurana et al. | |
| 2016/0105811 A1 | 4/2016 | Khurana et al. | |
| 2016/0116309 A1 | 4/2016 | Silva et al. | |
| 2016/0119592 A1 | 4/2016 | Stuart et al. | |
| 2016/0131607 A1 | 5/2016 | Silva et al. | |
| 2016/0173743 A1 | 6/2016 | Masarik | |
| 2016/0223588 A1 | 8/2016 | Fox | |
| 2016/0290869 A1 | 10/2016 | Frank et al. | |
| 2016/0300341 A1 | 10/2016 | Hay et al. | |
| 2017/0061663 A1 | 3/2017 | Johnson et al. | |
| 2017/0078544 A1 | 3/2017 | Ringsrud et al. | |
| 2017/0078545 A1 | 3/2017 | Kearsley et al. | |
| 2017/0111258 A1 | 4/2017 | Bezold et al. | |
| 2017/0116725 A1 | 4/2017 | Stuart et al. | |
| 2017/0140520 A1 | 5/2017 | Stuart et al. | |

FOREIGN PATENT DOCUMENTS

| | | |
|---|---|---|
| CN | 101672864 A | 3/2010 |
| CN | 103606276 A | 2/2014 |
| CN | 103760448 A | 4/2014 |
| DE | 102004007314 A1 | 8/2005 |
| EP | 2230605 A1 | 9/2010 |
| EP | 2570879 A2 | 3/2013 |
| EP | 2683146 A1 | 1/2014 |
| EP | 2684731 A1 | 1/2014 |
| EP | 2778628 A2 | 9/2014 |
| JP | 2008232637 A | 10/2008 |
| WO | 0203029 A1 | 1/2002 |
| WO | 2011131758 A1 | 10/2011 |
| WO | 2012170941 A1 | 12/2012 |
| WO | 2012170946 A2 | 12/2012 |
| WO | 2012170949 A2 | 12/2012 |
| WO | 2012170953 A2 | 12/2012 |
| WO | 2012170954 A2 | 12/2012 |
| WO | 2013052196 A1 | 4/2013 |
| WO | 2013052383 A1 | 4/2013 |
| WO | 2014012070 A1 | 1/2014 |
| WO | 2014043592 A2 | 3/2014 |
| WO | 2014082097 A1 | 5/2014 |
| WO | 2014085699 A1 | 6/2014 |
| WO | 2014093721 A2 | 6/2014 |
| WO | 2014093724 A1 | 6/2014 |
| WO | 2014170306 A1 | 10/2014 |

OTHER PUBLICATIONS

Fluke 3000 FC Series Test Tools Fluke, Mar. 31, 2014, Retrieved from URL: http://www.mouser.com/catalog/specsheets/Fluke; 12 pages.

Fluke Connect TM Wi-Fi Connection to Thermal Imager, May 31, 2014, Retrieved from URL: http://www.bergeng.com/mm5/downloads/fluke/FC_ti90_qreng000.pdf; 2 pages.

Fluke Corporation, "Measuring from a Safe Distance from the Fluke Connect app," 1 page, May 12, 2014, URL: https://www.youtube.com/wach.

Son et al., "Vibration displacement measurement technology for cylindrical structures using camera images," Nuclear Engineering and Technology, vol. 47, No. 4, Mar. 27, 2015, pp. 488-499.

Ti125, Ti110, Ti105, Ti100, Ti95, and Ti90 Industrial-Commercial Imagers, May 31, 2014, Retrieved from URL: http://www.farnell.com/datasheets/1829789.pdf; 4 pages.

U.S. Appl. No. 15/190,792, filed Jun. 23, 2016, and entitled Thermal Anomaly Detection, 61 pages.

International Search Report and Written Opinion for PCT/US2015/050578, dated Feb. 15, 2016, 15 pages.

U.S. Appl. No. 14/855,884, filed Sep. 16, 2015, and entitled "Test and Measurement System With Removable Imaging Tool," 30 pages.

U.S. Appl. No. 14/855,844, filed Sep. 16, 2015, and entitled "Method of Attaching Camera or Imaging Sensor to Test and Measurement Tools," 29 pages.

U.S. Appl. No. 14/855,989, filed Sep. 16, 2015, and entitled "Display of Images From an Imaging Tool Embedded or Attached to a Test and Measurement Tool," 30 pages.

U.S. Appl. No. 62/068,392, filed Oct. 24, 2014, and entitled "Imaging Sysem Employing Fixed, Modular Mobile, and Portable Infrared Cameras With Ability to Receive, Communicate, and Display Data and Images With Proximity Detection," 9 pages.

U.S. Appl. No. 14/855,864, filed Sep. 16, 2015, and entitled "Mobile Device Used With Isolated Test and Measurement Input Block," 28 pages.

Li et al., "A Machine Vision Method for the Measurement of Vibration Amplitude," Meas. Sci. Technol., vol. 18, 2007, 11 pages.

Guoxiong et al., "Measurement and Control Circuit," China Machine Press, Version 3, Mar. 2008, Section 2.3, with partial English translation, 6 pages.

\* cited by examiner

TRIGGERED OPERATION AND/OR RECORDING OF TEST AND MEASUREMENT OR IMAGING TOOLS

CROSS-REFERENCES

This application claims the benefit of U.S. Provisional Application No. 62/076,088, filed Nov. 6, 2014 and U.S. Provisional Application No. 62/051,930, filed Sep. 17, 2014, the content of which is hereby incorporated by reference in its entirety.

BACKGROUND

Various parameters and other data can be useful in monitoring the operation of equipment. For example, electrical properties of equipment can provide valuable information regarding power consumption of the equipment. Power quality measurements can be used to determine information regarding the operating conditions of power systems. Other data, such as temperature data (e.g., from an infrared camera, thermocouple, or other temperature measuring device) can provide additional detail regarding potential trouble spots within an electrical system.

Since many data streams can be useful for monitoring the operating conditions and/or quality of equipment, a plurality of sensors may be used to monitor a system. For example, a technician can periodically visit a site and perform a variety of measurements to monitor operation of equipment at the site. To eliminate such costly requirements, many pieces of monitoring equipment can be set up to continually monitor various properties of the system. However, the cost and data storage requirements of operating such equipment can put an unnecessary burden on the resources of the system.

SUMMARY

Embodiments of the invention are directed to systems and methods for acquiring measurement data and/or image data. Systems can include a test and measurement tool configured to generate measurement data and an imaging tool configured to generate image data. In some examples, a processor in communication with the imaging tool and the test and measurement tool can be configured to receive image data from the imaging tool. In the event that the received image data satisfies one or more predetermined conditions, the processor can trigger the test and measurement tool to perform one or more corresponding operations.

In some examples, the imaging tool can generate infrared image data representative of infrared radiation from the target scene. In some such embodiments, the image data satisfying one or more predetermined conditions can include a temperature condition. The one or more corresponding operations can include various tasks such as performing a specific type of measurement or adjusting measurement properties. For example, the one or more corresponding operations can include adjusting the frequency of a measurement, duration of a measurement, or the type of measurement performed by the test and measurement tool.

Additionally or alternatively, the processor can be configured such that, in the event that received measurement data satisfies one or more predetermined conditions, the processor can trigger the imaging tool to perform one or more corresponding operations. The one or more predetermined conditions can relate to a variety of measurement data, such as electrical parameters of an object under test. For instance, in various embodiments, the one or more predetermined conditions can include at least one of a resistance, current, or voltage condition. In some examples, the one or more triggered operations can include one or more of triggering the capturing a single image, triggering the capture of a plurality of images, triggering the starting of a video recording, or triggering the stopping of a video recording.

The processor can additionally or alternatively determine an amount of power or energy lost due to heat dissipation of an object under test based on received information. For example, the processor can analyze a load present on an object under test based on one or both of the measurement data and image data. In some such examples, the processor is configured to determine the amount of additional load that can be placed on the object under test before a potential safety hazard occurs. In various embodiments, any information determined by the processor can be processed and prepared for display to a user.

DETAILED DESCRIPTION

Embodiments of the invention generally relate to methods and devices for utilizing imaging tools for adjusting or operating test and measurement tools, including, for example, power equality equipment. Exemplary test and measurement tools can include, but are not limited to, digital multimeters, power quality tools, current measurement tools, vibration tools, portable oscilloscope tools, laser alignment tools, ultrasonic test tools, insulation resistance testers, multi-function electrical test tools, single-function electrical test tools, contact temperature measurement tools, humidity measurement tools, air-flow measurement tools, air temperature measurement tools, air quality and particulate measurement tools, pressure measurement tools, gas detectors and analyzers. Various test and measurement tools can include one or more primary functions the test and measurement tool is configured to perform. In some examples, the primary function of a test and measurement tool can include performing one or more primary measurement. For instance, a primary function of some current measurement tools can include measuring an electrical current.

In some embodiments, the imaging tool can include one or more cameras, sensors, or other imaging device (generally referred to as an imaging device). One or more imaging devices of the imaging tool can be capable of detecting any combination of visible light (VL), near infrared (NIR), short-wavelength infrared (SWIR), long-wavelength infrared (LWIR), terahertz (THz), ultraviolet (UV), X-ray, or other wavelengths. In some examples, the one or more imaging devices are configured to generate image data representative of at least partially overlapping target scenes. The imaging tool can include one or more cameras (e.g., an infrared (IR) camera and a VL camera) for capturing a plurality of images of substantially the same or overlapping scenes.

In general, the imaging tool can be in communication with the test and measurement tool in any number of ways, for example as described in U.S. patent application Ser. No. 14/855,884, filed Sep. 16, 2015, and entitled "TEST AND MEASUREMENT SYSTEM WITH REMOVABLE IMAGING TOOL," which is assigned to the assignee of the instant application, and which is hereby incorporated by reference in its entirety. The communication can be wired or wireless. In some examples, the imaging tool can be built-in to or otherwise permanently or removably affixed to the test and measurement tool, for example, as described in U.S. patent application Ser. No. 14,855/844, filed Sep. 16, 2015, and entitled "METHOD OF ATTACHING CAMERA OR IMAGING SENSOR TO TEST AND MEASUREMENT TOOLS," which is assigned to the assignee of the instant application, and which is hereby incorporated by reference in its entirety.

Figure 1B:
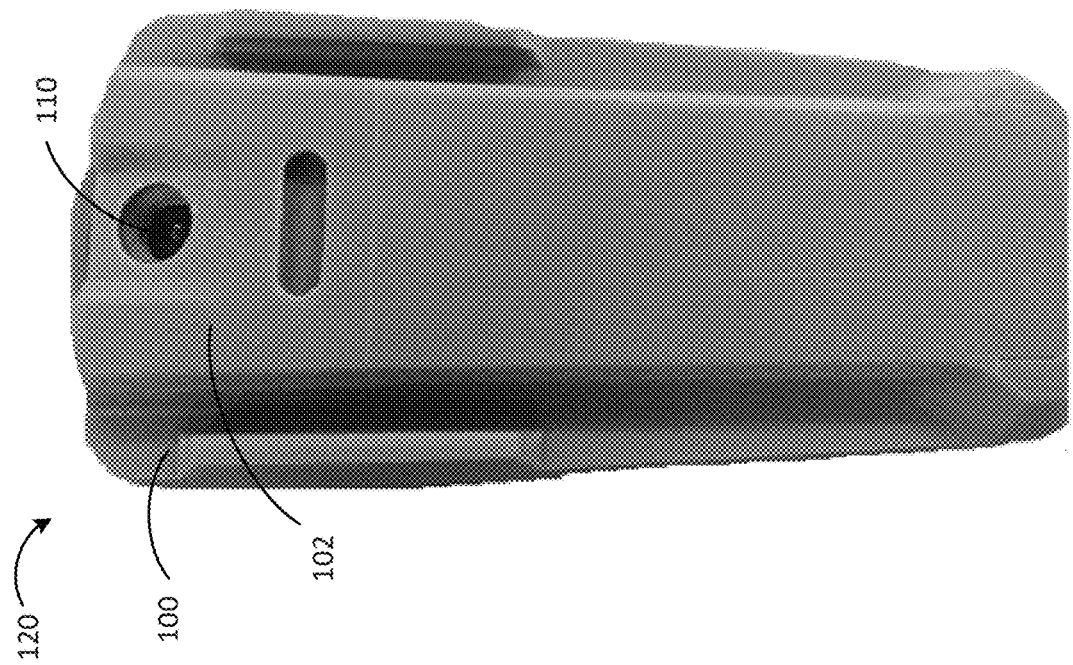
FIGS. 1A and 1B provide front and back views of an exemplary system including a test and measurement tool and an imaging tool.
Figure 1A:
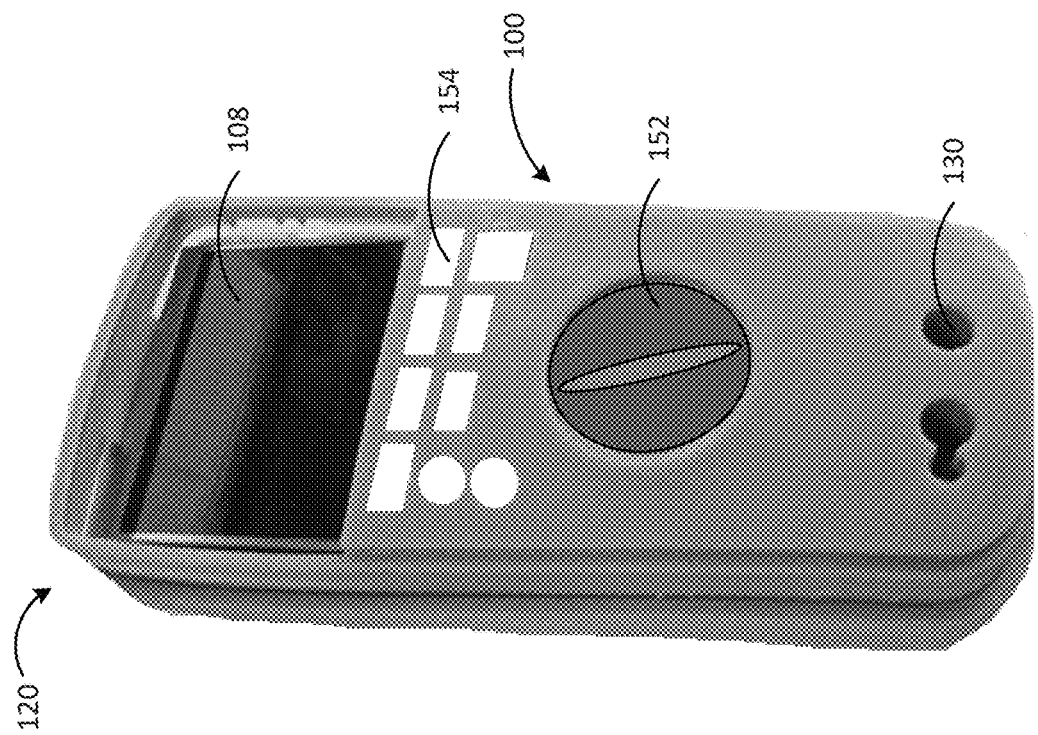

FIGS. 1A and 1B provide front and back views of an exemplary system including a test and measurement tool and an imaging tool. The embodiment of FIGS. 1A and 1B includes a test and measurement tool 100 and an imaging tool 110 combined into a single combination tool 120. In the illustrated embodiment, test and measurement tool 100 includes a back surface 102 through which the imaging tool 110 operates.

In some examples, imaging tool 110 can include a plurality of sensing components. For example, imaging tool 110 may include one or both of an infrared (IR) camera and a visible light (VL) camera. It will be appreciated that various imaging tools such as 110 can include any combination of appropriate sensors capable of detecting a variety of wavelengths.

In the example of FIGS. 1A and 1B, imaging tool 110 is integrated into test and measurement tool 100. That is, the system of FIG. 1 shows a combination tool 120 having integral test and measurement tool 100 and imaging tool 110. Imaging tool 110 includes a camera capable of detecting radiation in one or more ranges of wavelengths. As described, imaging tool 110 may include a plurality of cameras for detecting radiation in different wavelength spectrums. In some examples, the imaging tool may include a plurality of sensor arrays, each sensor array sensitive to a different range of wavelengths. Some such embodiments include optics for separating light incident to imaging tool and substantially directing light within certain wavelength ranges to corresponding sensor arrays.

The combination tool 120 of FIGS. 1A and 1B may be configured to generate image data and measurement data substantially simultaneously. In some examples, combination tool 120 includes a display (not shown) capable of presenting one or more of image data, measurement data, or other information. Additionally or alternatively, any one or more of the test and measurement tool 100, imaging tool 110, and combination tool 120 can communicate one or more of measurement data, image data, or combined measurement and image data to any other system component. In some examples, such data may be communicated to an external device, as described in U.S. patent application Ser. No. 14/855,989, filed Sep. 16, 2015, and entitled "DISPLAY OF IMAGES FROM AN IMAGING TOOL EMBEDDED OR ATTACHED TO A TEST AND MEASUREMENT TOOL," which is assigned to the assignee of the instant application, and which is hereby incorporated by reference in its entirety.

In the front view of FIG. 1A, the tool 120 includes inputs 130, for example, for receiving one or more accessories (e.g., test leads). The one or more accessories can be used for interfacing with an object under test for generating measurement data representative of at least one parameter of a device under test. In some embodiments, test and measurement tool 100 in combination tool 120 may perform a plurality of different measurement functions via inputs 130. In some embodiments, the measurement function is selectable, for example, via a user interface 150. Interface 150 can include one or more elements by which a user can interact with the tool 120, such as a selection knob 152 or buttons 154, or other interface elements such as a touchscreen, switches, and the like.

Combined tool 120 includes a display 108. Display 108 can be used to present various information to the user. In some examples, display 108 can be configured to present measurement data generated by the test and measurement tool 100. Additionally or alternatively, the display 108 can be configured to present image data generated by imaging tool 110. In some embodiments, a combination of measurement data and image data can be presented on the display 108 for presentation to a user.

Figure 2:
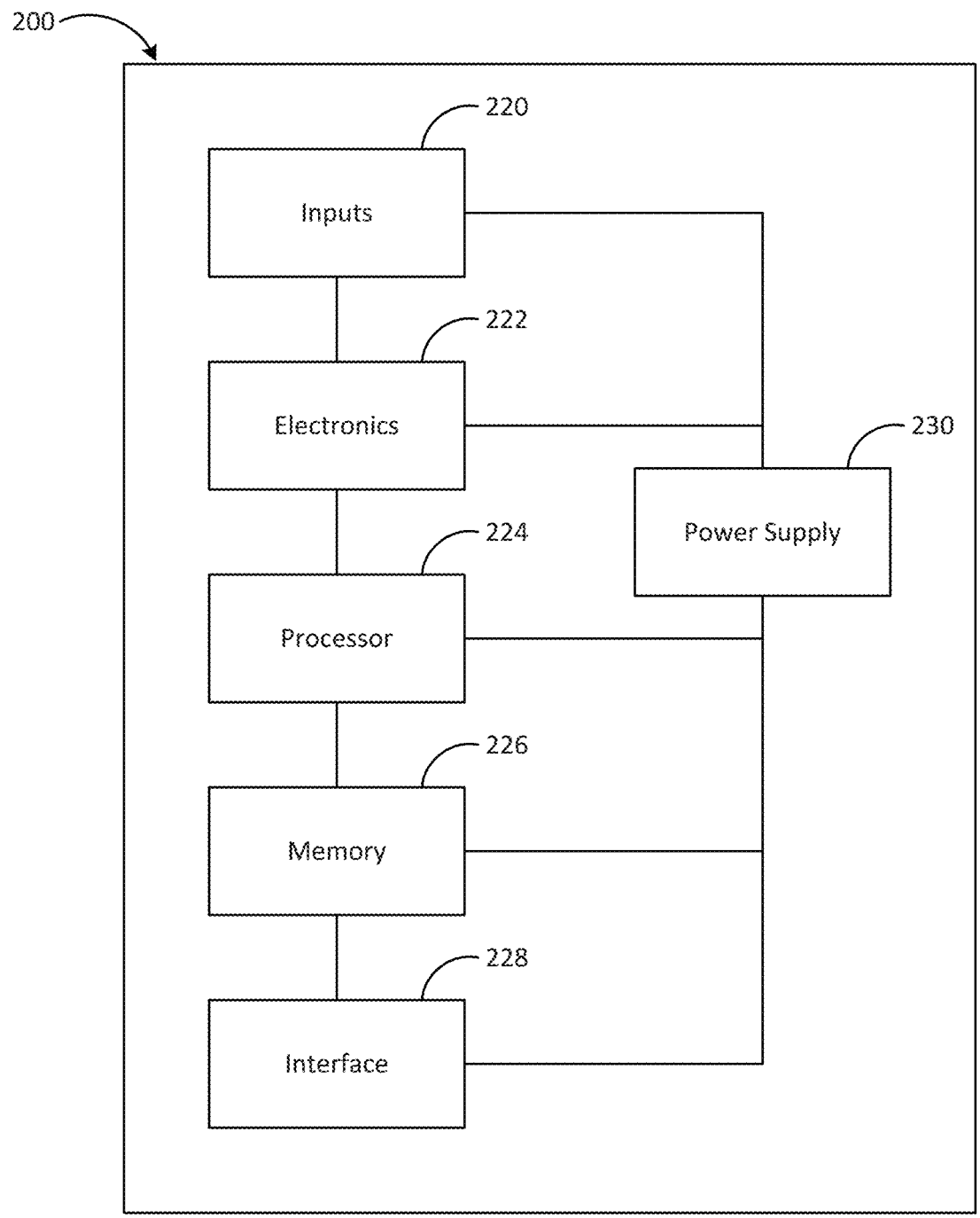
FIG. 2 is an exemplary schematic diagram of a test and measurement tool comprising a variety of components.

FIG. 2 is an exemplary schematic diagram of a test and measurement tool comprising a variety of components. In the illustrated example, the test and measurement tool 200 may include one or power supplies 230 for providing electrical power to any of a variety of system components for performing a variety of tasks, such a performing one or more primary functions. In some embodiments, the one or more power supplies 230 may include one or more batteries. Additionally or alternatively, the test and measurement tool 200 may be capable of running on AC power, e.g., from a standard wall receptacle. In some such embodiments, one or more batteries of the test and measurement tool 200 may be charged while the tool 200 is operating on or otherwise plugged into an AC power source. In some examples, the test and measurement tool may additionally or alternatively be powered via a parasitic power supply, such as inductive or direct in-line supplies proximate other powered devices.

The test and measurement tool may include one or more inputs 220 configured to interface with an object under test for performing a measurement of a parameter thereof. In various examples, the one or more inputs 220 may include any appropriate input for performing a measurement of a parameter of a device under test. The one or more inputs 220 may provide a signal indicative the parameter of the object under test to any combination of electronics 222 and a processor 224 for further processing of the signal. In some examples, the test and measurement tool 200 includes a memory 226 for storing information indicative of one or more parameters of a device under test. In some embodiments, one or both of processor 224 and memory 226 may be integrated into electronics 222.

In some embodiments, test and measurement tool 200 may include an interface 228 for interacting with a user. In some examples, interface 228 may include one or more controls for receiving user inputs. Controls may include, for example, buttons, switches, knobs, touch screens, etc. In some embodiments, a user may initiate a measurement or other test and measurement tool 200 function using controls. Additionally or alternatively, the interface may include a display for communicating information to a user. For example, the display may present a user with selectable options, such as various functions selectable by the user via controls. Additionally or alternatively, the display may be configured to present the results of one or more measurements performed by the test and measurement tool for observation by a user. In some examples, a display is capable of presenting textual measurement information (e.g., letters, numbers, etc.), but is not capable of displaying image information, such as described elsewhere herein. Additionally or alternatively, in some embodiments, power supply 230 is not capable of supporting a continuous image display without severely depleting the available power supply. Thus, in some examples, presentation of image data via interface 228 may be impossible or impractical.

In some examples, interface 228 may provide an interface with additional equipment. For example, in some embodiments, interface 228 can provide a communication interface between the test and measurement tool 200 and an imaging tool (e.g., 110) or an external device (e.g., smartphone, tablet, etc.). In various embodiments, interface 228 can be used to export received measurement data, such as from inputs 220, or a processed result, for example, from processor 224.

Figure 3:
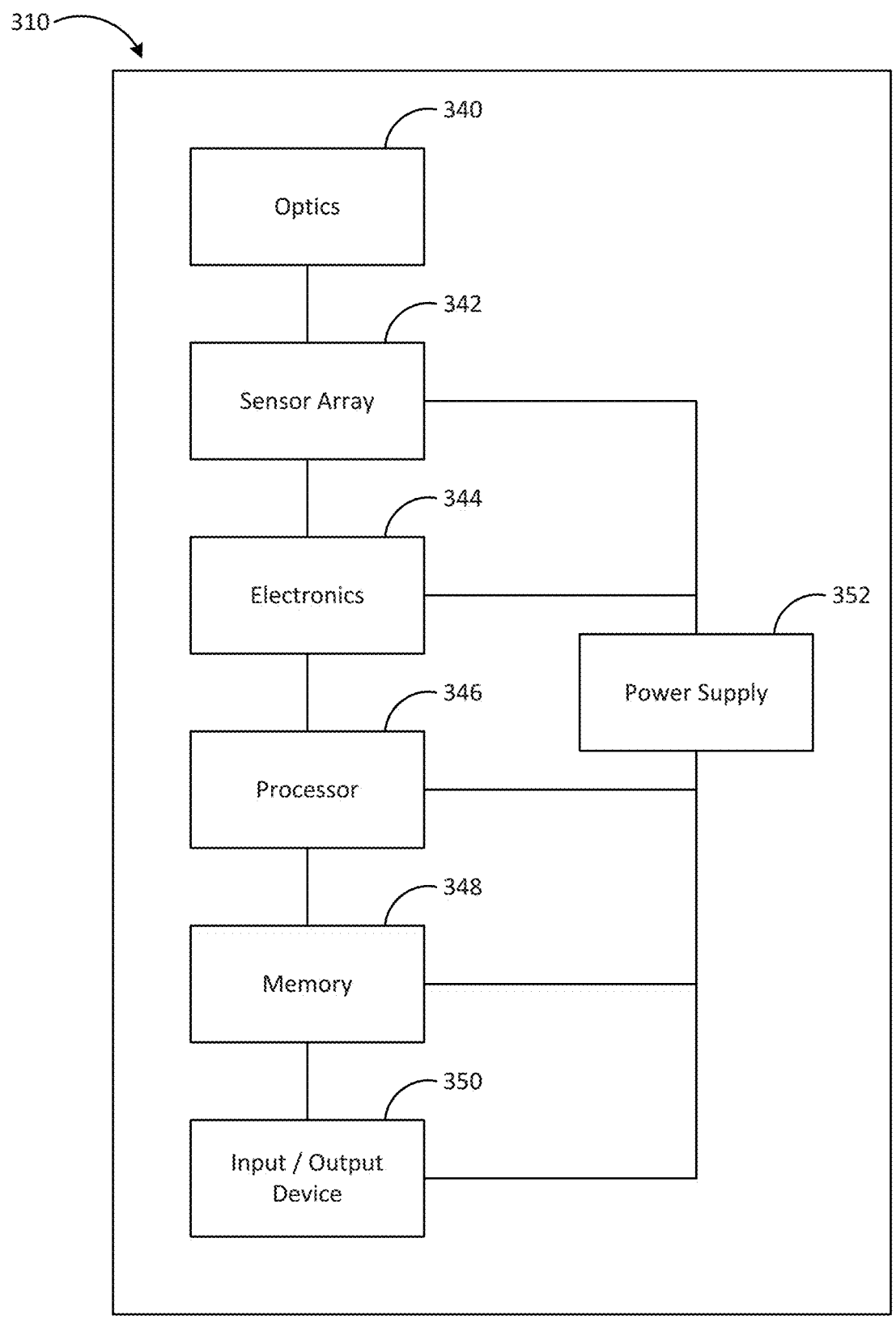
FIG. 3 shows an example block diagram of an imaging tool configured for receiving electromagnetic radiation according to some exemplary systems.

FIG. 3 shows an example block diagram of an imaging tool configured for receiving electromagnetic radiation according to some exemplary systems. In the illustrated embodiment, imaging tool 310 includes optics 340, a sensor array 342, electronics 344, one or more processors 346, memory units 348, input/output devices 350, and a power supply 352.

The optics 340 can include optics for focusing, deflecting, and/or reflecting electromagnetic radiation from a target object onto the sensor array 342. In some examples, the sensor array 342 may include an infrared sensor array sensitive to infrared radiation. An imaging tool including such an infrared sensor array may be used to make non-contact temperature measurements.

In such embodiments, the infrared sensor array 342 can include one or more thermal detectors such as microbolometers or thermopiles, or could be composed of photon detectors such as photodiodes or phototransistors, or other thermal or photon detection device. In some examples, an infrared sensor array may include a single detector, for instance, for determining a spot temperature within a target scene. Alternatively, an infrared sensor array may comprise a plurality of such detectors for acquiring at least one of a spot temperature (e.g., via an average value of sensor array sensors) or a two-dimensional infrared image.

One of skill in the art will recognize that various sensor arrays (e.g. photon sensor arrays) can be used, and can be used in combination with one or more infrared sensor arrays. In some examples, the sensor array is fixed within the imaging tool 310 to provide a more durable device having fewer moving and moveable parts. In various examples, the size and positioning of the detector depends on the characteristics of the optical system (e.g., the relationship between optics 340 and sensor array 342). In some embodiments, the detector is generally circular having a diameter of 0.5 mm to 3 mm. However detectors of any size and shape should be considered within the scope of the invention. The detector produces a signal as a function of the radiation or other scene data imaged thereupon. These signals can be processed by known methods to indicate a temperature or other metric indicated via the received radiation.

A person of skill in the art will recognize that many materials and materials technologies may be suitable for use in an infrared sensor array. In some examples, the infrared sensor array 342 responds to infrared radiation ranging from approximately 0.7 microns to approximately 30 microns and can have a peak sensitivity within this range. The electronics 344 receive the output signals from the sensor array 342 and pass them to the processor 346 for analysis.

When an infrared sensor assembly is used, the processor 346 can be used to run infrared thermometer applications including, but not limited to, deciding if the target object sufficiently fills the field of view, and averaging output signals for a period of time to reduce the impact of noisy measurements on the accuracy of the measured temperature. In the case of alternative sensor arrays (e.g., sensitive to one or more of visible light, ultraviolet light, X-rays, etc.), the processor 346 may be used to run corresponding imaging applications.

Memory 348 can include but is not limited to, RAM, ROM, and any combination of volatile and non-volatile memory. A power supply 352 can include, but is not limited to, a battery, a parasitic energy system (e.g., an inductive system), and components for directly receiving AC power. The power supply 352 can provide power to the sensor array 342, electronics 344, processor 346, memory 348, and/or input/output devices 350. An input/output device 350 can include, but is not limited to, triggers to start and stop the image capture, visual displays, speakers, and communication devices that operate through wired or wireless communications.

For instance, in some examples, the input/output device 350 of the imaging tool 310 can include a display capable of displaying an image produced from data conveyed or captured by one or more sensor arrays 342. In some examples, the display can be further configured to show other data, for instance, data from the test and measurement tool (e.g., via communication port 104) or other external sources. Additionally or alternatively, input/output device 350 may be capable of one or more of receiving measurement data from a measurement tool and communicating at least one of image data or received measurement data to an external device, such as a tablet, smartphone, computer, etc.

In some systems, communication between the imaging tool and the test and measurement tool can include external devices or remote locations to facilitate measurement as described in U.S. Provisional Patent Application No. 62/068,392, filed Oct. 24, 2014, which is assigned to the assignee of the instant application, and which is hereby incorporated by reference in its entirety. Additionally or alternatively, one or both of imaging tools and test and measurement tools can be adapted to communicate with a user's mobile device, which may be otherwise not necessarily capable of performing various imaging or other measurement functions. Accordingly, in some examples, any combination of imaging tools and test and measurement tools can interface with a mobile device as described in U.S. patent application Ser. No. 14/855,864, filed Sep. 16, 2015, and entitled "MOBILE DEVICE USED WITH ISOLATED TEST AND MEASUREMENT INPUT BLOCK," which is assigned to the assignee of the instant application, and which is hereby incorporated by reference in its entirety. Similarly, the imaging tool can include an input block or input jack to permit functionality typically found in a test and measurement tool to be performed by the imaging tool.

Accordingly, in some embodiments, the imaging tool can acquire image data (e.g., IR image data) and communicate image data to the test and measurement tool. In some examples, the image data communicated by the imaging tool to the test and measurement tool can include raw image data for analysis. In other examples, the imaging tool can perform analysis on the image data (e.g., perform radiometric calculations regarding IR image data), and transmit such analyzed data in addition to or alternatively to the raw image data to the test and measurement tool.

In some embodiments, the test and measurement tool can perform one or more functions based on received image data from the imaging tool. For instance, the imaging tool can be configured to generate image data representative of equipment under test. The imaging tool can observe the equipment under test and can provide control signals to the test and measurement tool to effect one or more functions of the test and measurement tool based on the control signals.

In some examples, the imaging tool can generate IR image data representative of a heat pattern across a target scene (e.g., a field of view including equipment under test). The imaging tool can analyze IR image data and generate additional data, such as alarm data corresponding to the IR image data. Alarms signals can be representative of detected temperatures or other data within the IR image data generated by the imaging tool. Exemplary alarm conditions can include hot thresholds, cold thresholds, temperature range thresholds, differential thresholds, or other appropriate alarm conditions. Exemplary alarm conditions are described in U.S. Pat. No. 7,994,480, entitled "VISIBLE LIGHT AND IR COMBINED IMAGE CAMERA," which is assigned to the assignee of the instant application, and which is hereby incorporated by reference in its entirety.

Such alarm or other data parameters can be based on IR image data acquired by an imaging tool. Imaging tools can be used to collect such IR image data in a variety of ways. For example, the imaging tool can be configured to capture a live data stream of IR image data representative of the target scene. In other embodiments, the imaging tool can collect IR image data at predetermined time intervals (e.g., every 10 minutes, every hour, every day, or any other appropriate interval). In some examples, a user can define an analysis interval to designate the timing of IR image data capture and/or analysis. In some examples, the imaging tool generates a live stream of IR image data or periodic IR image data and analyzes data trends in the IR image data. The imaging tool can generate alarm data or other signals representative of the analyzed data trends in the IR image data.

As described, the imaging tool can be in communication with a test and measurement tool. In some examples, the imaging tool can send signals to the test and measurement tool, such as alarm signals or other signals or messages representative of or based on image data generated by the imaging tool. In some instances, the signals sent from the imaging tool include image data. In some such embodiments, the image data can be analyzed by the test and measurement tool, the imaging tool, or a combination thereof. In some examples, contents of the signals communicated from the imaging tool to the test and measurement tool can be determined by a user or programmer of the system.

In various embodiments, the test and measurement tool can perform any combination of a variety of operations in response to a received signal. For example, the test and measurement tool can perform a single instantaneous measurement, begin a measurement recording, end a measurement recording, change measurement recording parameters (e.g., frequency of measurement, duration of measurement, etc.), change the type of measurement, begin or end transmission of data to another location, combine data from multiple devices, communicate severity or warning information to another location, or other appropriate functions. For instance, a test and measurement tool can be configured to perform a single measurement when the image data reaches an alarm level. In another example, a test and measurement tool can be configured to initiate a continuous or periodic measurement, and to stop such a measurement when the image data no longer meets the alarm level.

In another example, the test and measurement tool can begin recording measurement data in response to received data from the imaging tool. As described elsewhere herein, in some embodiments, the test and measurement tool can be configured to combine the image data from the imaging tool with the measurement data measured by the test and measurement tool. In some such embodiments, the recorded measurement data can be combined with recorded image data to generate a video having substantially real-time measurement data included in the image stream. In an intermediate embodiment, the received data from the imaging tool can trigger the test and measurement tool to record measurement data at a particular rate or frequency. The periodically captured measurement data can be combined with corresponding image data captured by the imaging tool substantially simultaneously in order to generate a series of images from the imaging tool including corresponding measurement data by the test and measurement tool.

Exemplary data from the imaging tool that can cause such action by the test and measurement tool can include instantaneous or prolonged detection of alarm data. Data from the imaging tool can be compared to a variety of alarm conditions over one or more time periods, some or all of which can correspond to one or more operations to be performed by the test and measurement tool. In an exemplary embodiment, the test and measurement tool will perform a first operation if the data from the imaging tool meets a first alarm condition for a first amount of time, will perform a second operation if the data from the imaging tool meets the first alarm condition for a second amount of time, and will perform the first and second operations if the data from the imaging tool meets a second alarm condition. In general, any combination of data from the imaging tool can correspond to any combination of operations from the test and measurement tool.

It will be appreciated that, while embodiments described above generally relate to detected image data effecting one or more operations by a test and measurement tool, similar configurations can exist in which detected measurement data can effect one or more operations by an imaging tool. For instance, a test and measurement tool (or a mobile device or imaging tool having test and measurement capability via, for example, an isolated input block) can receive measurement data (e.g., an electrical current) that can be compared to a threshold. In the event the detected measurement data exceeds the threshold, the imaging tool can be actuated to capture image data of a target scene (e.g., the electrical components through which the current is flowing). As described previously, one or more imaging tool operations can be performed as a result of one or more detected parameters from the test and measurement tool. In various embodiments, the imaging tool can acquire a single image upon detection of an alarm condition or capture periodic images or a video stream while the alarm condition persists. Different actions performed by the imaging tool in response to various alarm conditions may be possible. In some embodiments, any alarm condition detected by an imaging tool or a test and measurement tool, and any resulting responsive action by the test and measurement tool or the imaging tool, respectively, may be programmable by a user.

In any such embodiments, one or both of the imaging tool and the test and measurement tool can be powered in any of a variety of ways. As described above, in some examples, each of the imaging tool and the test and measurement tool are battery powered. The imaging tool and test and measurement tool can share one or more batteries, or can be powered by one or more separate batteries. In other embodiments, one or both of the imaging tool and the test and measurement tool can receive direct power (AC or DC) from a power source, such as a power cabinet, wall socket, or other available power source. Additionally or alternatively, either or both of the test and measurement tool and the imaging tool can parasitically draw power from other powered components, such as equipment under test or other proximate electrical equipment.

Figure 4:
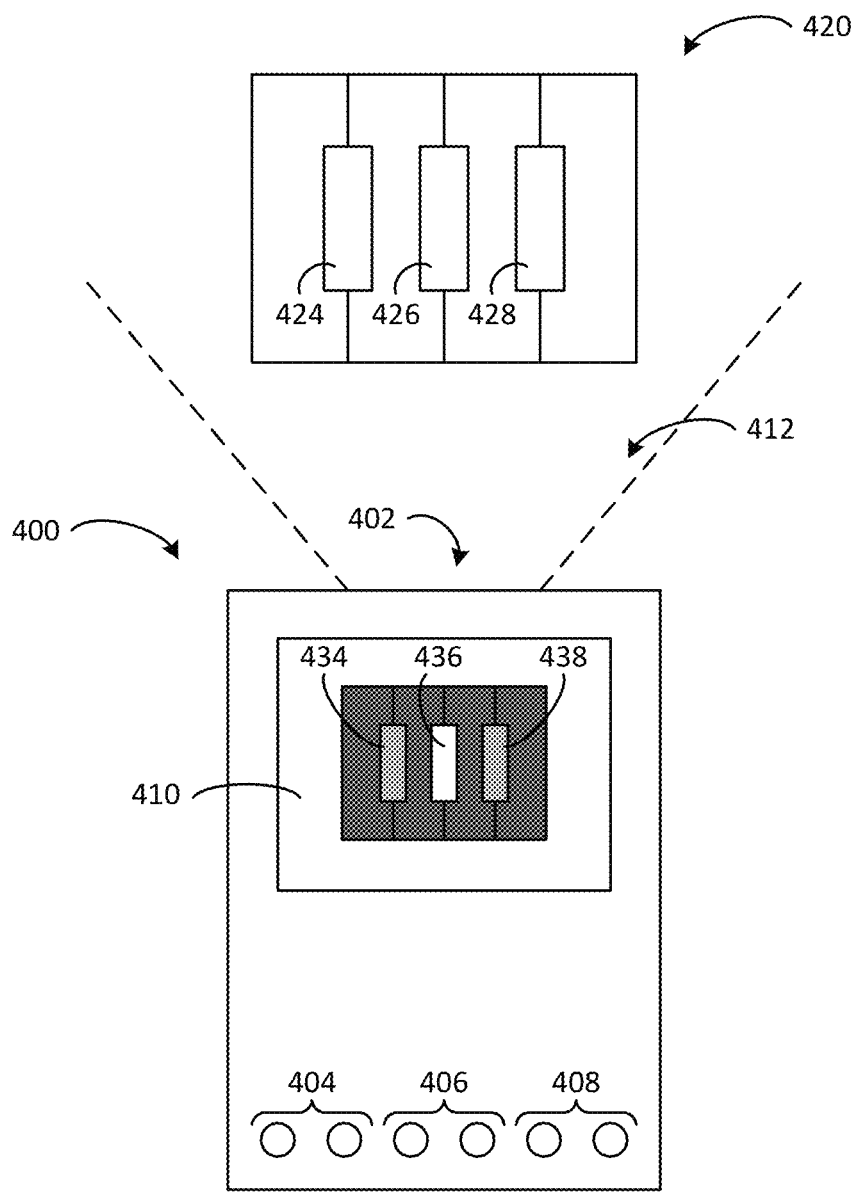
FIG. 4 is an exemplary embodiment of an integrated imaging and test and measurement tool.

FIG. 4 is an exemplary embodiment of an integrated imaging and test and measurement tool. The test and measurement tool 400 of FIG. 4 includes an imaging tool 402 configured to acquire image data of a target scene. In some examples the imaging tool 410 is integrated into the test and measurement tool 400 to form a combination tool. The imaging tool 402 can include an IR imaging device for detecting the thermal signature of the target scene. The test and measurement tool 400 further includes a series of interface jacks 404, 406, 408 for receiving test wires for performing measurements.

As shown, in the illustrated example, the test and measurement tool 400 is positioned proximate a power system 420 including three current-carrying conductors 424, 426, 428. In some examples, such current-carrying conductors each carry current in one phase of a three-phase power system. In the illustrated arrangement, power system 420 is within the field of view 412 of the imaging tool 402. The imaging tool 402 can include and IR imaging device for detecting the heat pattern across the power system 420. In such a configuration, the interface jacks 404, 406, 408 can be connected to current-detecting devices (e.g., current clamps) for detecting the current flowing through each of conductors 424, 426, 428, respectively. In some instances, wires connected to interface jacks 404, 406, 408 can be inserted in series with conductors 424, 426, 428, respectively, such that the test and measurement tool can measure the current flowing through each conductor in a traditional series current measuring configuration.

During operation, image data from the imaging tool 402 can be used to detect information regarding the power system 420. Such image information can include alarm or other information that triggers subsequent operation of test and measurement tool 400. For example, the detection of a thermal alarm condition (e.g., a detected temperature of one of conductors 424, 426, 428) can trigger the test and measurement tool 400 to perform a power quality measurement of the power system 420 using interface jacks 404, 406, 408. In general, any appropriate measurement can be performed by test and measurement tool 400 in response to a predetermined detected parameter in the image data.

Acquired data, including image data or other data from the imaging tool, measurement data from the test and measurement tool, or any other appropriate data, can be adapted for display to a user. For example, in the illustrated embodiment, the test and measurement tool 400 further includes a display 410 for displaying any combination of measurement data, image data, or any other acquired data. For example, generated image data and/or measurement data may be received by a processor configured to process the received data for presentation on display 410.

In the illustrated embodiment, the display 410 includes an IR image representation of the electrical system 420. The display 420 includes representative image data of components 434, 436, 438, corresponding to conductors 424, 426, 428, respectively. As shown, the IR image data is represented in grayscale false-color palette, with components 434 and 438, representative of conductors 424 and 428, being at a first temperature, and component 436, representative of conductor 426, being at a second temperature, higher than the first. The detected temperatures of current-carrying conductors 424, 26, and 428 can be used to determine the amount of power dissipated as heat from the power system 420. Such data can be used by the imaging tool, the test and measurement tool, or any other device capable of receiving the data to perform any number of additional or alternative calculations. For instance, the data can be used to determine the amount of power loss (e.g., $I^2R$ losses in W) and to further determine the amount of energy (e.g., in Wh) lost or a monetary cost of such losses over a specified period of time if such losses are not addressed and corrected. Any such data can be presented to a user via a display such as display 410 in test and measurement tool 400 in FIG. 4, or any other display incorporated into or in communication with any of a test and measurement tool, an imaging tool, and a combination tool.

In some examples, one or both of measurement data from a test and measurement tool and image data from an imaging tool can be used to determine the amount of power dissipated over a resistance. For example, IR image data can be used to determine a temperature or temperature change of an electrical component. Such image data can be used to determine the amount of power or energy lost from the power system to heating a particular electrical component.

Similarly, data from one or both of the test and measurement tool and the imaging tool can be used to analyze a present load on a power system with respect to the temperature. Such analysis can be used to determine the amount of additional load that could be placed on the power system before a potential safety hazard becomes possible or likely. For example, the data can predict the additional load that can possibly be added before entering a potentially hazardous thermal runaway situation. The measurement system can notify a user with appropriate information, such as a predicted safe remaining power availability, a power load severity status, component fault messages, a warning message, or other signals. Such a notification can be presented on the test and measurement tool, the imaging tool, or any other device in communication with the system. Notifications can include any combination of visible, audible, vibrational, or other possible notifications.

In some embodiments, acquired data from the measurement system can be graphed for further analysis or for presentation to a user. Generally, graphs can include any variety of visually presented data, including but not limited to line graphs, charts, plots, vector diagrams, or any other visual representation of acquired data points and their relation to other data points or temporal periods. Some such graphs that can be created from acquired data include, for example, impedance versus temperature of one or more electrical components or systems. Further examples can include, for instance, harmonic distortion or an impedance signature versus temperature or temperature gradient present in one or more electrical components or systems. Such data can be analyzed by a processor included in or otherwise in communication with one or both of the imaging tool and the test and measurement tool. For example, the frequency content of the electrical power present in a power system can be analyzed to determine information regarding harmonic content in power data. Graphs of such data, in addition to data used to generate such graphs or other information determined from the data or graphs, can be generated and presented to a user for analysis or observation. Such displays can be presented on any combination of the imaging tool, the test and measurement tool, or any other device in communication with the measurement system. In some embodiments, image data and measurement data can be combined for further analysis.

In some examples, data can be acquired, graphed, and/or combined in response to one or more detected occurrences such as a threshold detected in one or more data sets. As described elsewhere herein, the triggering of one or more operations such as various capturing and/or combining of data can be initiated. For example, in the event that the imaging tool detects abnormal heating of equipment under test in a target scene, combined image data (e.g., temperature data from an IR imaging device) and measurement data can be plotted and analyzed to determine possible issues with the equipment under test. In some instances, power quality data can be combined with IR image data to analyze data for various issues, such as sigma currents, harmonic distortion producing straight currents in electrical windings, unbalance caused by differences in impedance in multi-phase systems, and positive and negative sequence harmonics.

While shown in FIG. 1 as being integrated together into a combination tool, the imaging tool and the test and measurement tool may be separate or separable. In some such embodiments, a separated imaging tool can be embedded, permanently affixed, or temporarily affixed in or on a surface or structure proximate the equipment under test so that the equipment under test is within the field of view of the imaging tool. Methods of attachment can include, but are not limited to: magnet, strap, suction cup, clip, clamp, gimbal mount, adhesive, screws, or other types of fasteners that facilitate optimal placement of the imaging tool in relation to the equipment under test.

Figure 5:
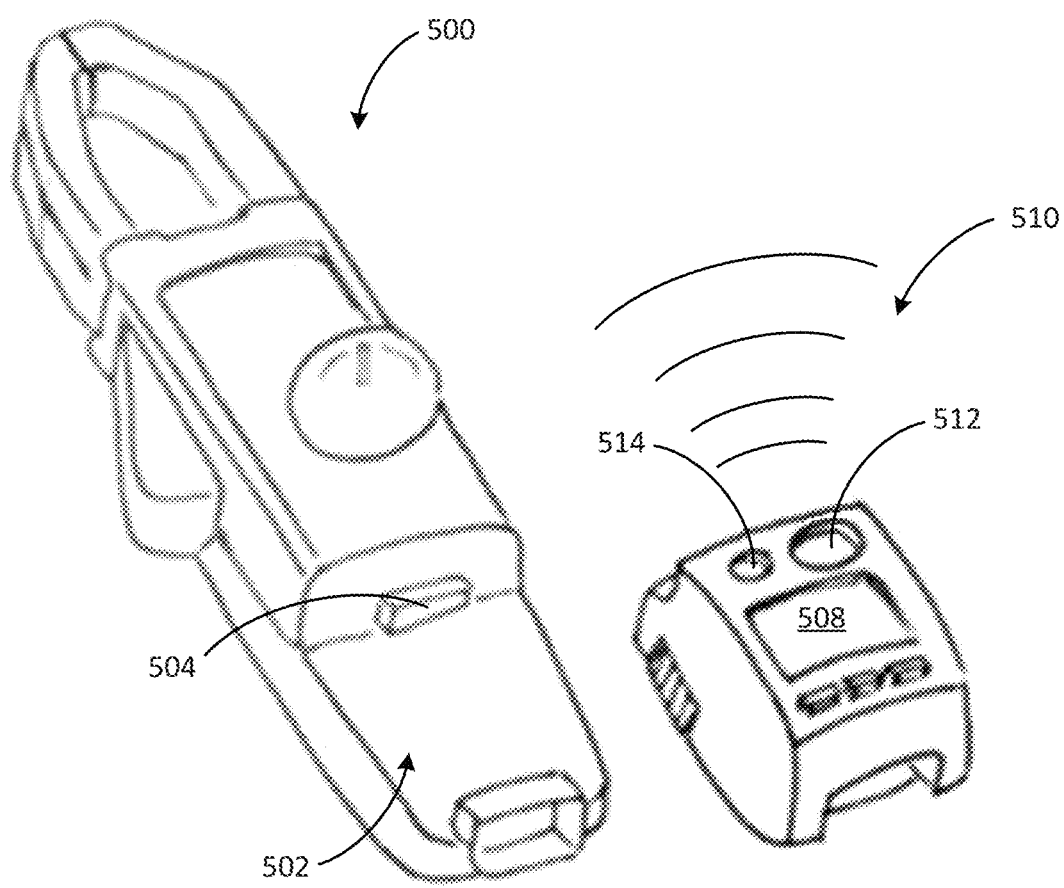
FIG. 5 is a view of an exemplary system including an imaging tool and a test and measurement tool.

FIG. 5 is a view of an exemplary system including an imaging tool and a test and measurement tool. The illustrated embodiment of FIG. 5 includes a test and measurement tool 500 and an imaging tool 510. As described, the test and measurement tool 500 can be configured to perform at least one primary function, such as measuring a current (e.g., a current clamp). The illustrated imaging tool 510 includes an infrared (IR) camera 512 and a visible light (VL) camera 514, though it will be appreciated that various imaging tools such as 510 can include any combination of appropriate detectors. In some examples, the imaging tool 510 can include a display 508 for visual presentation of one or both of, for example, IR and VL image data, such as shown in display 410 in FIG. 4. In some embodiments, the test and measurement tool 500 can removably receive the imaging tool 510 at a receiving portion 502 of the test and measurement tool 500. In various embodiments, the imaging tool 510 can be secured to the test and measurement tool 500 in any number of ways, for example, via a press fit, snap fit, clip, magnet, hook and loop fastener, or the like.

In some examples, the test and measurement tool 500 can include a communication port 504 for communicating with the imaging tool 510. In various embodiments, communication port 504 can communicate with the imaging tool 510 when the imaging tool 510 is received by the test and measurement tool 500, such as via a physical connection. In some examples, the communication port 504 is capable of wireless communication such that the test and measurement tool 500 may communicate with the imaging tool 510 when the imaging tool 510 is separate from the test and measurement tool 500. Communication port 504 can facilitate any known form of communication between the imaging tool 510 and the test and measurement tool 500, including wired or wireless communication (e.g., radio frequency (RF) communication, infrared (IR) communication, serial communication, Bluetooth, etc.). In some embodiments, communication port 504 provides two-way communication between the test and measurement tool 500 and the imaging tool 510.

During exemplary operation of a system such as that in FIG. 5, the imaging tool 510 includes an IR 512 and a VL 514 camera and is positioned separate from the test and measurement tool 500 and proximate an object under test such that the object is within the field of view of at least one of the cameras 512, 514. The test and measurement tool 500 can be configured to measure at least one parameter related to the object under test, such as a current flowing through the object. The test and measurement tool 500 can measure the at least one parameter while the imaging tool 510 captures image data of the object under test.

The test and measurement tool 500 and imaging tool 510 can be in communication to share data, such as via communication port 504. For instance, in some examples, the imaging tool 510 can communicate received image data to the test and measurement tool 500 for display on the test and measurement tool. Additionally or alternatively, the test and measurement tool 500 can communicate the at least one parameter to the imaging tool 510 for display. Communication can be accomplished via, for example, IR communication (e.g., IrDA), Bluetooth communication, or other appropriate wired or wireless data transmission. Resultantly, a combined display of image data and the at least one parameter can be presented at one or both of the test and measurement tool 500 and the imaging tool 510.

In some examples, communication port 504 is positioned proximate a receiving portion 502 of the test and measurement tool 500. In some such embodiments, the imaging tool 510 may be attached to the receiving portion 502 of the test and measurement tool 500 and engage the communication port 504 of the test and measurement tool 500. Thus, the imaging tool 510 may be capable of communicating with the test and measurement tool 500 when received at the receiving portion 502 thereof. In some examples, communication between the imaging tool 510 and the test and measurement tool 500 via communication port 504 may be automatically initiated upon attaching the imaging tool 510 to the receiving portion 502 of the test and measurement tool 500.

As described elsewhere herein, communication between the imaging tool 510 and the test and measurement tool 100 may act to initiate one or more operations using at least one of the devices. For example, the imaging tool 510 may be configured to capture an image of an object under test in the event that measurement data from the test and measurement tool 500 meets at least one predetermined condition. Additionally or alternatively, the test and measurement tool 500 can be configured to acquire measurement data if image data from the imaging tool 510 (e.g., an average temperature, a maximum temperature, a minimum temperature, etc.) meets a predetermined condition.

Processed or unprocessed data can be communicated between the imaging tool 510 and the test and measurement tool 500 via communication port 504 to trigger such an action. For example, in some embodiments, the imaging tool 510 may analyze generated image data (e.g., via a built-in processor) and communicate to the test and measurement tool 500 if an alarm condition is met, causing an appropriate response by the test and measurement tool 500. Additionally or alternatively, the test and measurement tool 500 may process image data generated via the imaging tool 510 to determine whether or not any alarm conditions are satisfied. Similarly, in some embodiments, one or both of the imaging tool 510 and the test and measurement tool 500 may process measurement data to determine whether or not any alarm condition is satisfied.

Figure 6:
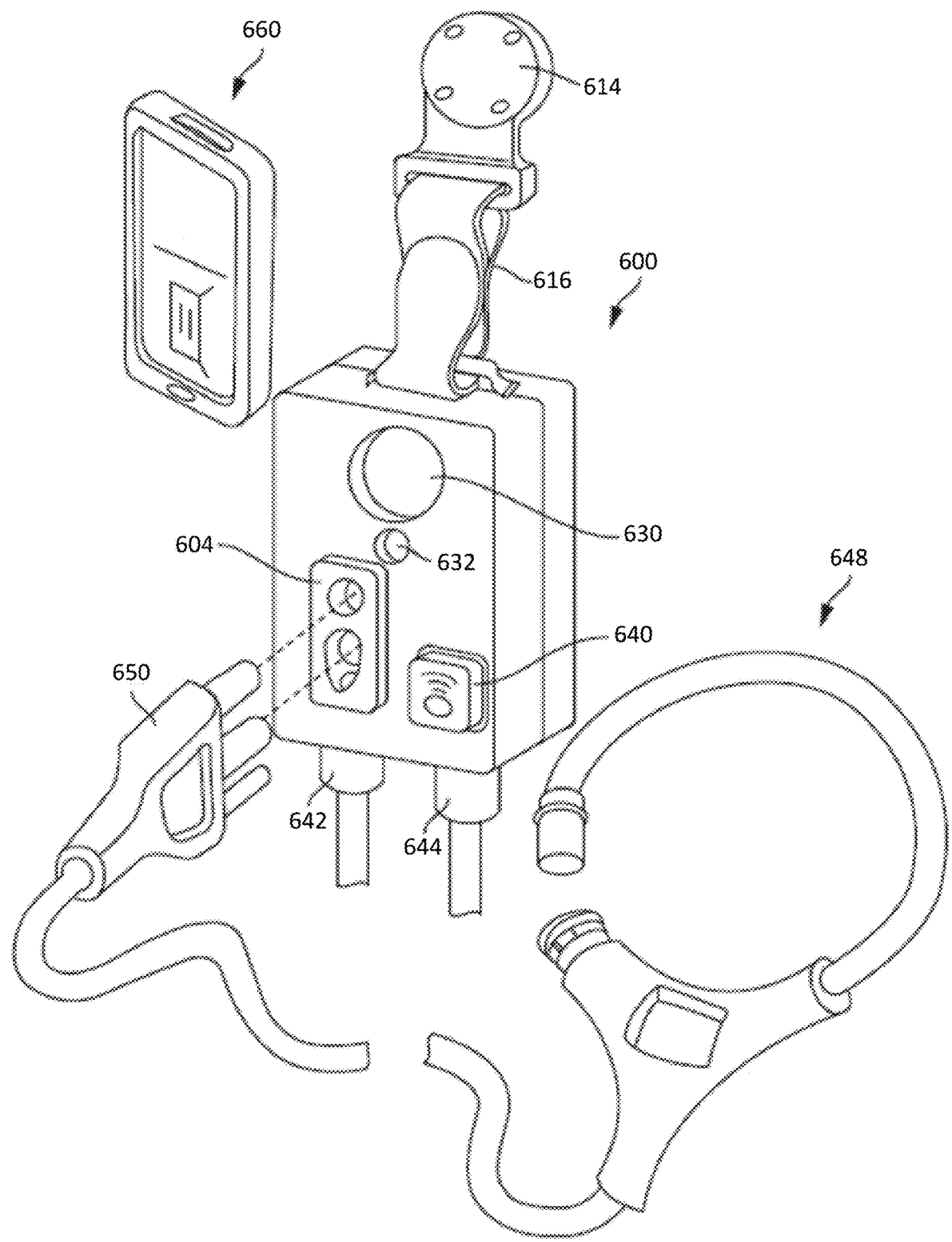
FIG. 6 illustrates an exemplary system in accordance with some embodiments.

FIG. 6 illustrates an exemplary system in accordance with some embodiments. The system of FIG. 6 includes a tool 600 in communication with a measurement accessory 648. In the illustrated embodiment, tool 600 includes an interface 604 for receiving an interfacing plug 650 of the measurement accessory 648. The tool 600 can receive a signal from the measurement accessory 648 via the interface 604 and generate measurement data therefrom. In the illustrated embodiment, the test and measurement accessory 648 can be configured to measure a current flowing through a conductor and communicate data to the tool 600 representative of the amount of measured current. Accordingly, tool 600 may function as a test and measurement tool generating measurement data representative of at least one parameter of a device under test. In some examples, the test and measurement accessory 648 or the combination of the test and measurement accessory 648 and the tool 600 may be referred to as a test and measurement tool.

The tool 600 of FIG. 6 includes an IR imaging device 630 and a VL imaging device 632 for generating IR and VL image data representative of a target scene, respectively. Thus, tool 600 may similarly function as an imaging tool. IR and VL image data can be combined and displayed in any number of ways, such as those described in U.S. Pat. No. 7,535,002, entitled "CAMERA WITH VISIBLE LIGHT AND INFRARED BLENDING,", which is assigned to the assignee of the instant application, and which is hereby incorporated by reference in its entirety. Accordingly, the IR 630 and VL 632 imaging devices can acquire image data of a target scene which can be combined or otherwise displayed or analyzed by a user or a processing device. In some examples, the tool 600 includes a processor for performing any combination of processing IR and VL image data, processing measurement data from the measurement accessory 648, initiating one or more operations by one or more of the VL imaging device 632, the IR imaging device 630, and the measurement accessory 648 in response to received information, combining received data from any of such tools, or any other processing functions.

The tool 600 of FIG. 6 includes an attachment mechanism 614 for permanently or removably affixing the tool 600 to a surface. In some instances, a user can affix the tool 600 to a surface or structure proximate equipment under test so that the equipment under tests is in the field of view of the tool 600. The attachment mechanism 614 can include any appropriate material or construction for affixing to a surface or structure, such as a hook and loop material, a magnet, a snap, a clip, and the like. The attachment mechanism 614 can be secured to the tool 600 via a strap 616. In other embodiments, the attachment mechanism 614 can be attached directly to the tool 600.

FIG. 6 includes a mobile device 660, which can be in wired or wireless communication with the tool 600. The mobile device 660 can include a smartphone, tablet, or any other mobile device capable of performing any of receiving, processing, or displaying data. In some examples, the tool 600 includes a button 640 for activating a wireless interface of the tool 600. In some such examples, actuating button 640 enables wireless communication between the tool 600 and a mobile device such as 640. In some embodiments, the button 640 can enable wireless communication between the tool 600 and a test and measurement tool, or a remote location, for example over a network. The tool 600 of FIG. 6 includes a communication link 642 for communicating or receiving data or other signals to or from other devices. For instance, in some examples, the tool 600 can interface with the mobile device 660 or other equipment via a wired connection to the communication link 642.

The tool 600 can include a power input 644 for receiving power from a power source. For instance, the power input 644 can be coupled to an external power supply, such as a wall socket or other power supply. Additionally or alternatively, the tool 600 can include one or more batteries for powering the tool 600 or can parasitically receive power from a powered proximate device.

During an exemplary operation of the embodiment of FIG. 6, the tool 600 can generate measurement data regarding one or more parameters of equipment under test based on a received signal from the measurement accessory 648 via interface 604. The tool 600 can capture image data using one or both of the IR imaging device 630 or the VL imaging device 632. The tool 600 can process one or both of the image data and the measurement data to determine if any thresholds have been met. In response to any number of a variety of met thresholds or other predetermined conditions, the tool 600 can initiate one or more operations regarding one or both of the imaging device(s) 630, 632 and the measurement accessory 648 such as those described above.

In some examples, the tool 600 transmits data either wirelessly or via a wired connection (e.g., communication link 642) to a separate device, such as the mobile device 660 or other remote location. The separate device can analyze one or both of imaging data and measurement data, and can communicate commands back to the tool 600 in response to one or more satisfied thresholds or predetermined conditions. Additionally or alternatively, mobile device 660 can receive any combination of measurement data, IR image data, and VL image data from the tool 600. Accordingly, in some examples, the mobile device 660 can display any combination of such data, including measurement data (e.g., the amount of current flowing through a conductor), a VL image of the target scene, an IR image of the target scene, a combination VL and IR image of the target scene, and apparent temperature data of the target scene determined from the IR image data. In general, any combination of available data can be displayed.

Figure 7:
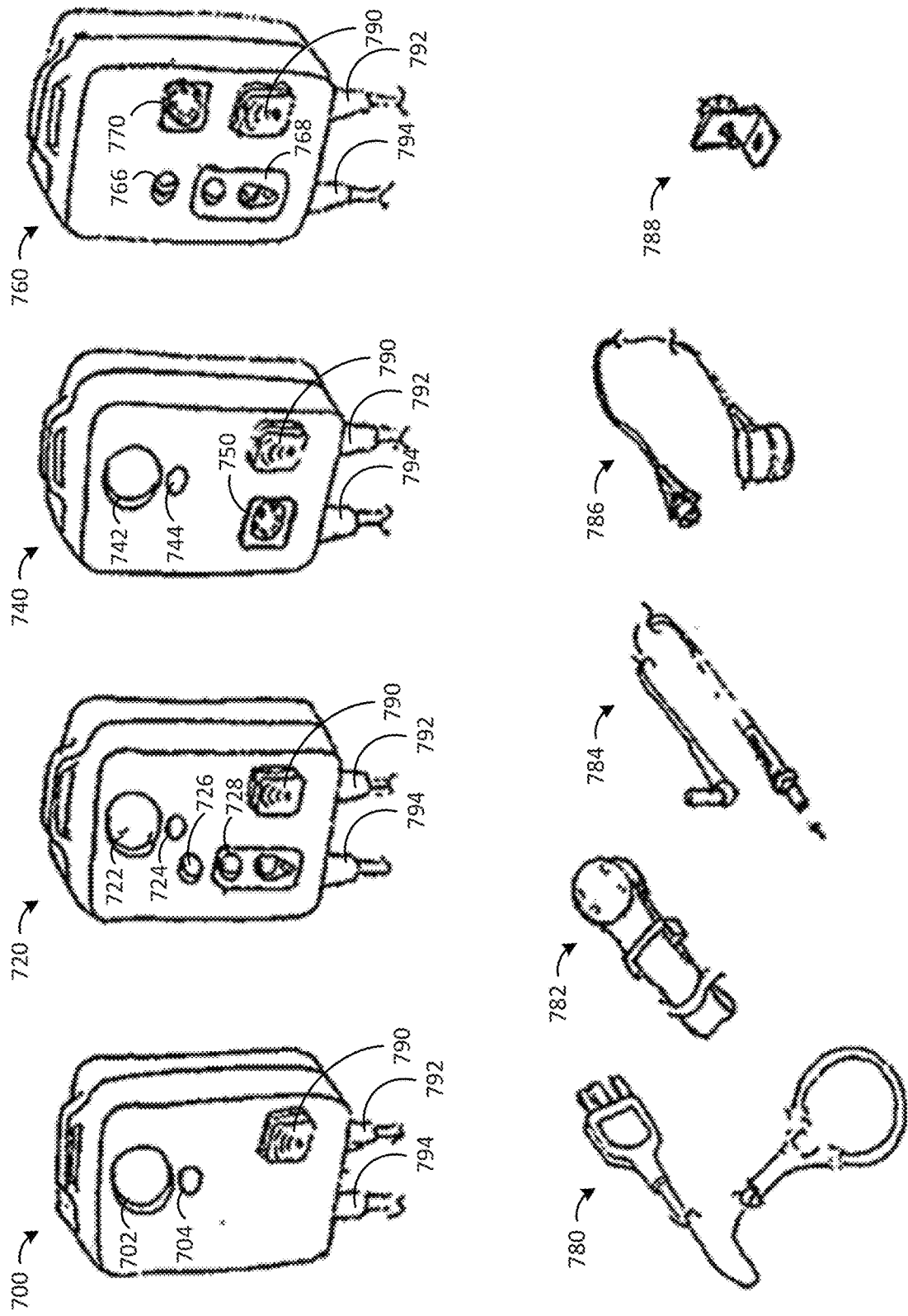
FIG. 7 shows a variety of tools and accessories capable of generating one or both of image data and measurement data.

While the system in FIG. 6 shows an exemplary combination of imaging and measurement functionality, a wide variety of different configurations are possible. For example, FIG. 7 shows a variety of tools and accessories capable of generating one or both of image data and measurement data. FIG. 7 shows a plurality of tools 700, 720, 740, and 760, each capable of performing one or more functions. Tool 700 includes an infrared imaging device 702 and a visible light imaging device 704. Accordingly, tool 700 is capable of generating image data representative of a target scene.

Similar to tool 7000, tool 720 includes an infrared imaging device 722 and a visible light imaging device 724, and is capable of producing one or both of infrared and visible light image data representative of a target scene. Tool 720 further includes a first input 726 and a second input 728 for interfacing with various accessories, such as test and measurement accessories. While shown as being different types of inputs, first input 726 and second input 728 could be the same type of input for interfacing with similar test and measurement accessories.

Tool 740 also includes an infrared imaging device 742 and a visible light imaging device 744, as well as an input 750 capable of interfacing with a test and measurement accessory. Accordingly, tool 740 may be capable of generating measurement data from a signal received via input 750 as well as one or both of infrared and visible light image data based on received radiation at infrared 742 and visible light 744 imaging devices, respectively.

In the illustrated embodiment of FIG. 7, tool 760 includes a first input 764, a second input 768, and a third input 770. First 766, second 768, and third 770 inputs may be like or different inputs. Each of first 764, second 768, and third 770 inputs may be capable of interfacing with one or more test and measurement accessories for generating measurement data representative of at least one parameter of a device under test.

FIG. 7 shows a variety of test and measurement accessories capable of interfacing with one or more of tools 720, 740, and 760 via at least one interface. For example, as shown, accessory 780 may be capable of producing a signal representative of a current flowing through a conductor. In the illustrated examples, accessory 780 may interface with inputs 728 and 768 of tools 720 and 760, respectively. Similarly, as shown, accessory 784 may be capable of producing a signal representative of a voltage at a device under test. Accessory 784 may interface with inputs 726 and 746 of tools 720 and 760, respectively. Accessory 786 may be capable of producing a signal representative of the vibration of a device under test, and may interface with inputs 750 and 770 of tools 740 and 760, respectively. Accessories 782 (e.g., a magnetic strap) and 788 (e.g., a bracket mount) may be used to secure any of tools 700, 720, 740, and 760 proximate a device under test to facilitate the acquisition of measurement data and/or image data representative of the device under test.

Accordingly, in the illustrated embodiments, tool 700 may be capable of generating infrared and visible light image data representative of a target scene. Tool 720 may be capable of generating infrared and visible light image data representative of a target scene, as well as measurement data representative of one or both of a voltage and a current associated with a device under test. Tool 740 may be capable of generating infrared and visible light image data representative of a target scene, as well as measurement data representative of the vibration associated with a device under test. Tool 760 may be capable of generating measurement data representative of one or more of a voltage, current, or a vibration associated with a device under test.

Each of tools 700, 720, 740, and 760 are shown including a communication button 790, which in various embodiments can be used to initiate communication (e.g., wireless communication) between the tool and an external device, such as a smartphone, tablet, etc. As shown, tools 700, 720, 740, and 760 also include channels 792, 794 which may facilitate the transfer of one or both of data and electrical power to or from the tools.

It will be appreciated that, while tools 700, 720, 740, and 760 show a variety of combinations of imaging devices (e.g., infrared and visible light imaging devices) and inputs integrated into single tools, additional devices, inputs, and combinations thereof are possible. As described elsewhere herein, any of tools 700, 720, 740, and 760 may be capable of generating image and/or measurement data associated with a device under test. In the event that one or both of received image and/or measurement data meets one or more predetermined conditions, the tool can be configured to perform subsequent actions corresponding to the met condition(s).

Figure 8:
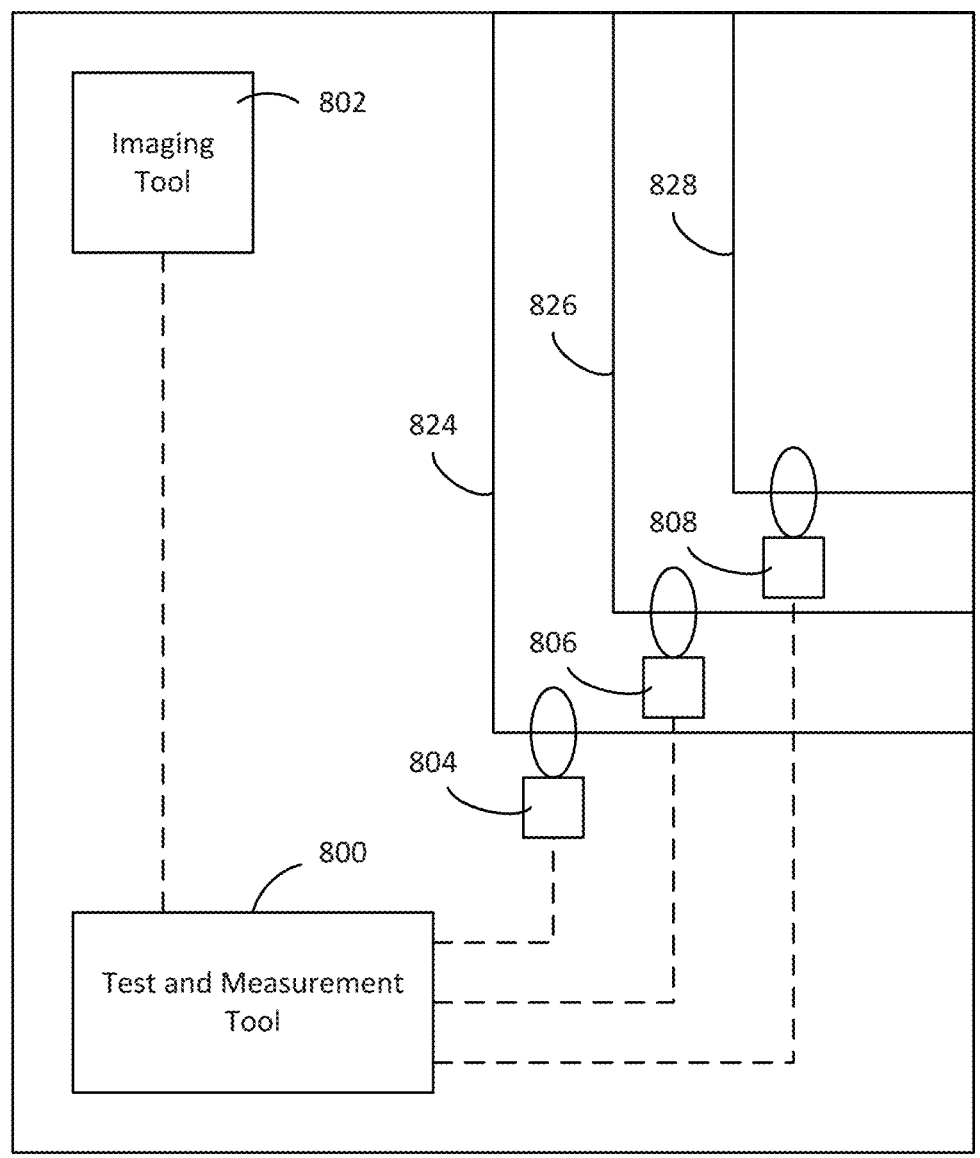
FIG. 8 shows a system including separated imaging tools and test and measurement tools.

FIG. 8 shows a system including separated imaging tools and test and measurement tools. In the system of FIG. 8, a test and measurement tool 800 is in communication with interfacing devices 804, 806, 808 configured to measure power data from conductors 824, 826, 828, respectively. In various embodiments, interfacing devices 804, 806, 808 can be standalone devices (e.g., current clamps) in communication with the test and measurement tool 800 and configured to provide measurement data thereto via wired or wireless communication. In other embodiments, interfacing devices 804, 806, 808 can include built-in features of the test and measurement tool 800. For instance, interfacing devices 804, 806, 808 can include inputs or leads directly coupled to the test and measurement tool and arranged to perform one or more measurements related to conductors 824, 826, 828.

As shown, the test and measurement tool 800 is in communication with the imaging tool 802. In some embodiments, the imaging tool 802 is structurally separate from the test and measurement tool 800, and communicates therewith by wired or wireless communication. During operation, imaging tool 802 can detect image data of the target scene, including parts of conductors 824, 826, 828. Image data can be analyzed by the imaging tool 802 or sent to the test and measurement tool 800 for analysis. In some embodiments, in the event analysis of the image data yields one or more predetermined outcomes, test and measurement tool 800 can initiate one or more measurements using interfacing devices 804, 806, 808. For instance, the imaging tool 802 can detect IR image data indicative of a first alarm condition, which causes the test and measurement tool 800 to perform a power quality measurement regarding conductors 824, 826, 828. In some examples, one or both of the imaging tool 802 and the test and measurement tool 800 can be in communication with an external or mobile device (not shown), such as described, for example, in U.S. patent application Ser. No. 14/855,989, which is incorporated by reference. In such embodiments, any or all of the analysis of the image data or the triggering of one or more measurements by the test and measurement tool 800 can be performed by the external device. In some examples, any of the devices can be in communication with a network for remote data communication or storage. For instance, image data or measurement data can be stored together in a memory in any of the imaging tool 802, the test and measurement tool 800, an external device, a remote location, or the cloud.

Figure 9:
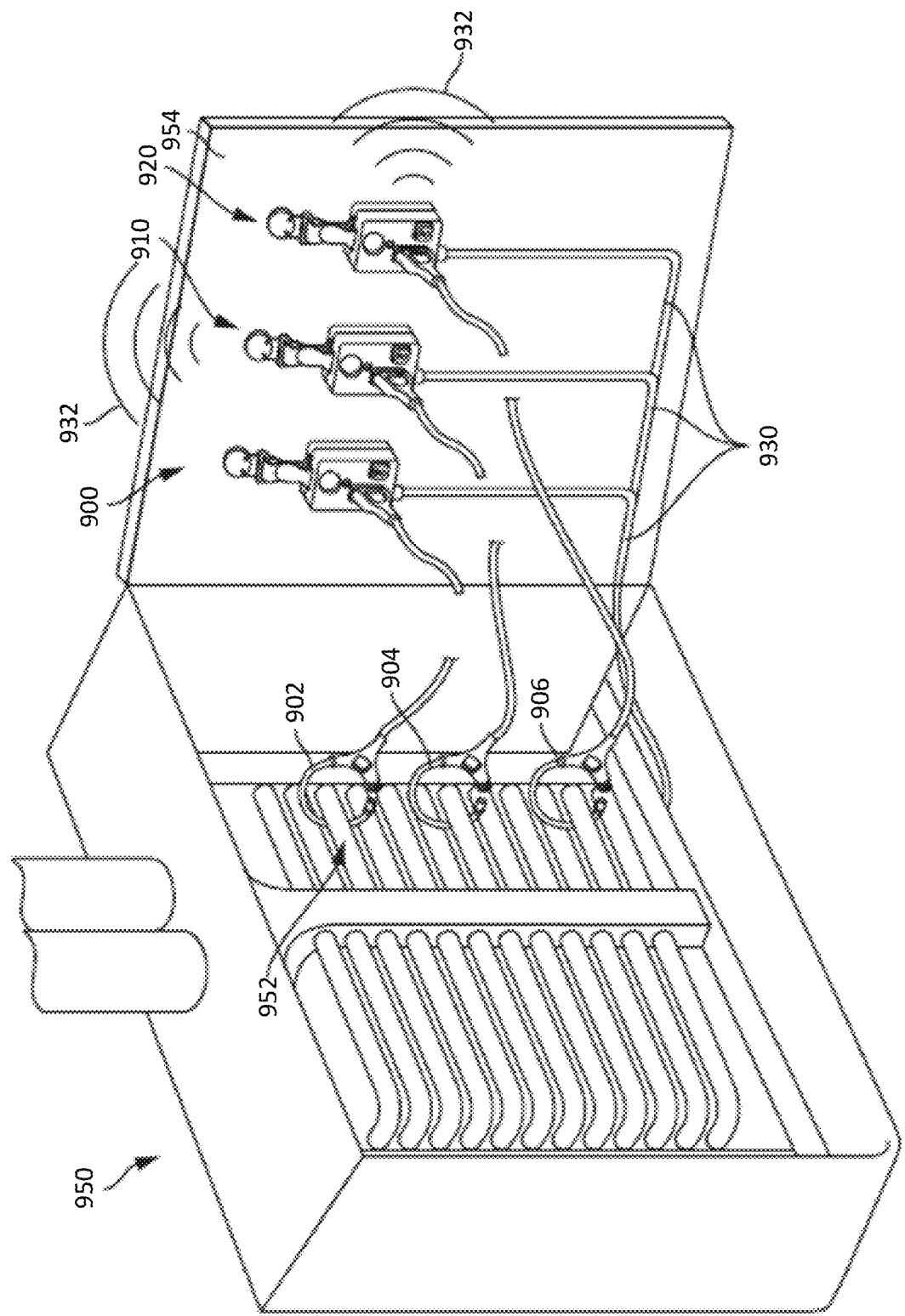
FIG. 9 shows an exemplary system including a plurality of tools for monitoring an electrical system.

FIG. 9 shows an exemplary system including a plurality of tools for monitoring a system. In the illustrated example, tools 900, 910, and 920 are affixed to the door 954 of an electrical cabinet 950 housing electrical equipment 952. The tools can be affixed to the door 954 by a variety of methods, such as magnetically, via hook and loop fasteners, etc. Tools 900, 910, and 920 are in communication with test and measurement accessories 902, 904, and 904, respectively, which are configured to produce signals representative of currents flowing through various pieces of electrical equipment 952. Accordingly, each of tools 900, 910, and 920 are capable of generating measurement data representative of the current flowing through portions of the electrical equipment 952. Additionally, each of tools 900, 910, and 920 include imaging devices capable of generating image data representative of a target scene. When the door 954 of the cabinet 950 is closed, the tools 900, 910, and 920 can be arranged so that the target scene for each of the imaging devices includes electrical equipment 952.

During operation, each of tools 900, 910, and 920 can monitor electrical characteristics of (e.g., the current flowing through) various portions of the electrical equipment 952 and/or image data (e.g., infrared image data) of the electrical equipment 952. As described elsewhere herein, when one or both of image data and measurement data meet one or more predetermined conditions, one or more of tools 900, 910, and 920 can perform one or more corresponding actions, for example, based on instructions stored in a memory accessible by a processor.

In the illustrated embodiment, tools 900, 910, and 920 can be powered via power cables 930. In various examples, power cables 930 may be powered from a power source in or proximate the cabinet 950, such as an outlet or the like. In other examples, power cables 930 may parasitically draw power from electrical equipment 952 within the cabinet. Tools 900, 910, and 920 may be configured to communicate one or both of image data and measurement data to an external device such as a smartphone, tablet, computer, or other device via wireless communication 932. In some such embodiments, a user such as a system technician can receive image and or measurement data regarding electrical equipment 952 from the tools 900, 910, and 920 without opening the electrical cabinet 950.

In various examples, any one or more of a test and measurement tool, an imaging tool, and an external device can include a display for displaying any acquired data or other available parameters. One or both of the test and measurement tool and the imaging tool can be configured to transmit any combination of data to the other device, to a third device, or to a remote location (e.g., via a wired connection, wireless connection, or over a network) for viewing and analysis by a user and/or a processor. In some examples, the remote location can receive data from one or both of the imaging tool and the test and measurement tool and can communicate command data to one or both of the imaging tool and the test and measurement tool to initiate one or more operations to be performed. That is, any combination of image data and measurement data can be communicated to and analyzed at a remote location. Subsequently, the remote location can command one or both of the imaging tool and the test and measurement tool to perform one or more operations based on the received data (e.g., in response to a met threshold).

During exemplary operation, embodiments of the invention generally relate to methods and devices for analyzing data regarding electrical resistance in a loaded circuit. Electrical resistance in a circuit under load can be observed in multiple ways. In one example, electrical resistance can be detected and measured as a voltage drop or as increased impedance across two different points in an electrical circuit. The resistance can be determined using a digital multimeter or resistance meter/ohmmeter. In a second example, electrical resistance can result in a detectable generation of waste heat in a circuit, which can be detected and measured through use of an infrared (IR) sensor (e.g., IR camera, combined IR and visible light (VL) camera as general described in U.S. Pat. No. 7,535,002, which is incorporated by reference).

In some analysis, the two methods described above can generally be combined. Methods of combining measurement data from, for example, a digital multimeter, with image data, for example from an IR imaging device, are generally described in U.S. Patent Publication No. US20140278259, corresponding to U.S. patent application Ser. No. 14/214,600, filed Mar. 14, 2014, and entitled "CAPTURE AND ASSOCIATION OF MEASUREMENT DATA," which is assigned to the assignee of the instant application, and which is hereby incorporated by reference in its entirety. By combining the use of these two methods, and displaying the data generated by both measurements/calculations to the user, it may be possible to more effectively diagnose and trend the severity of issues caused by high resistance connections, undersized conductors, or other electrical problems.

The combination of measurement data and image data can provide a user with a more complete analysis of a device under test than either measurement on its own. For example, a multimeter might detect undesirably increased resistance in a device under test, but the cause of the increased resistance is unknown. An IR imaging device can detect the IR signature (and therefore the heat pattern) of the device under test in order to localize the source of the increased resistance due to an increase in the local temperature. As described elsewhere herein, one or both of an imaging tool (e.g., an IR imaging device) and a test and measurement tool (e.g., a resistance measurement device) may automatically capture image data (e.g., IR image data) or measurement data (e.g., resistance data), respectively, in response to a satisfied alarm condition. Thus, various electrical issues, such as due to high resistances, can be effectively monitored to inform a user or technician before becoming severe. Additionally, a more complete analysis of the issue, such as a thermal analysis associated measurement data may be saved and associated with the device.

Figure 10:
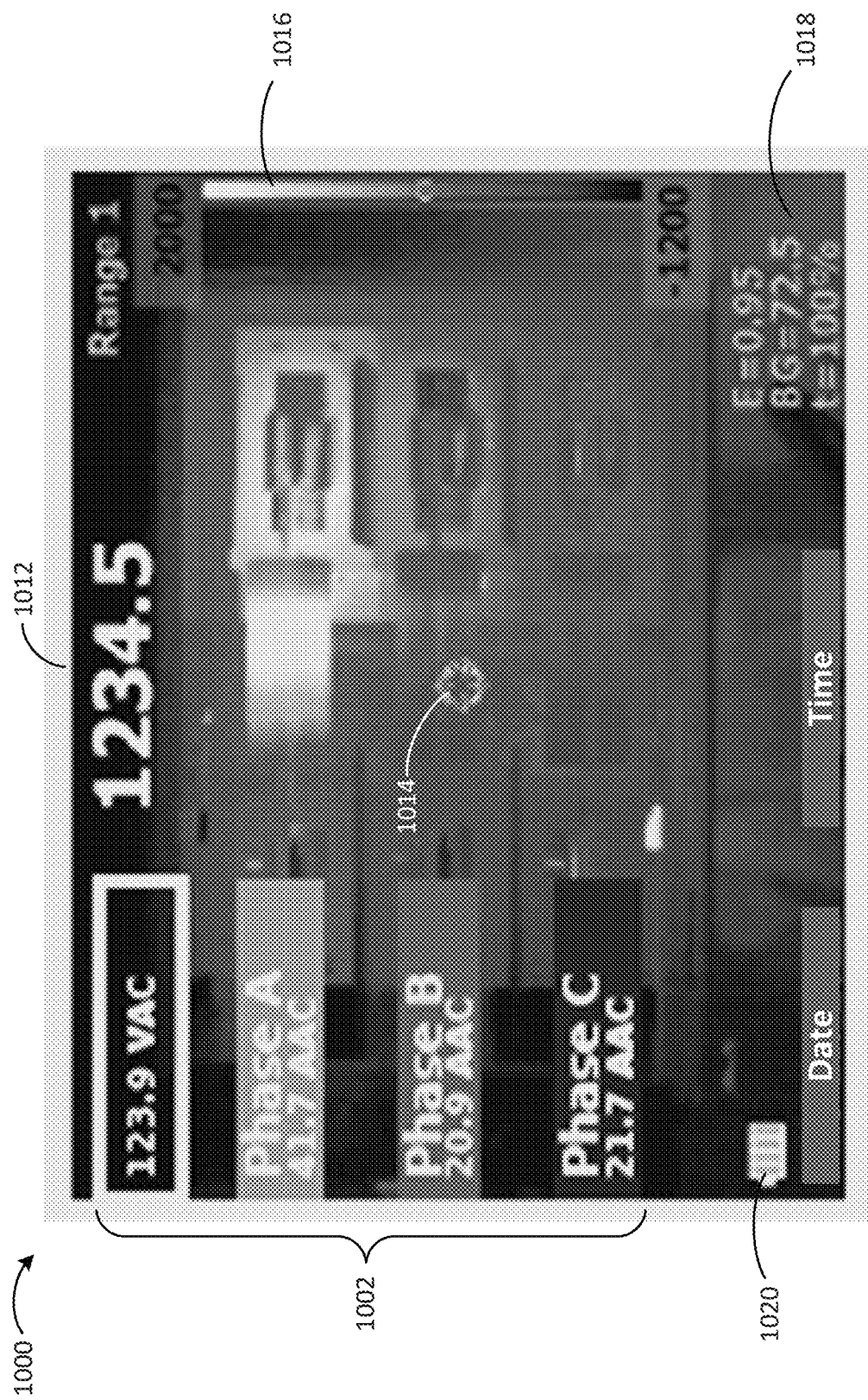
FIG. 10 is an exemplary display showing combined image and measurement data.

As described, in some examples, associated image and measurement data can be processed to generate a display comprising both the image data and the measurement data for presentation to a user such as is shown in FIG. 10. FIG. 10 is an exemplary display showing combined image and measurement data. In the illustrated example, the display 1000 includes measurement data 1002 comprising a measurement of current flowing through three conductors and a measured voltage. In some examples, measurement data 1002 may be acquired from a single test and measurement tool capable of measuring both current and voltage. In other examples, measurement data 1002 comprising both voltage and current data may be acquired from a plurality of test and measurement tools, such as a volt meter and an ammeter or other current measuring device.

In still further embodiments, known information regarding the object under test may be used to supplement measurement data. For instance, if the resistance values of the conductors of FIG. 10 are known, voltage or current measurements may be used to calculate the other. In some such examples, supplementary information such as resistance values may be stored in memory or input by a user via a user interface, for example in response to a prompt.

In the illustrated embodiment, image data presented on the display includes infrared image data representative of the thermal pattern across the scene. In the illustrated example, the display 1000 includes temperature information 1012 representative of the temperature of a selected spot 1014 on the display. In some examples, a user may adjust the location of spot 1014 for displaying a temperature of an area of interest. The display 1000 includes a temperature scale 1016 that associates colors within a palettized IR image to corresponding temperature values. Any appropriate palettization scheme may be used, such as grayscale, red-blue, ironbow, amber, and others. The temperature scale 1016 may be used to provide an indication to a viewer of the temperature of various points in the scene without requiring the placing of spot 1014 over each point.

In some embodiments, other data 1018 can be included in the display. Such data can include supplementary information for the image data (e.g., an emissivity value) or the measurement data. Other information that can be displayed include battery life information 1020 or information data received from one or more other devices (e.g., test and measurement tools, imaging tools, etc.) or a network such as the internet. In various examples, such data can include information from specifications, FAQs, operating instructions, and the like.

In various embodiments, at least one of the location and content of displayed data is predetermined based on which devices are in communication. For instance, in one example, any acquired data (e.g., at least one parameter from the test and measurement tool, image data from the imaging tool, etc.) can be displayed on the test and measurement tool by default. In another example, any acquired data is automatically displayed on an external device if one is in communication with at least one of the test and measurement tool or the imaging tool. In some embodiments, a user can define what information is displayed on which devices. In some such embodiments, the user can make a selection via a user interface on any of the test and measurement tool, the imaging tool, or an external device regarding the type and location of displayed data using any of the available devices in communication with the system (e.g., test and measurement tool, imaging tool, external device, etc.).

Various embodiments have been described. Such examples are non-limiting, and do not define or limit the scope of the invention in any way. Rather, these and other examples are within the scope of the following embodiments.

The invention claimed is:

1. A system including:
   a test and measurement tool configured to generate measurement data;
   an imaging tool configured to generate image data; and
   a processor in communication with the imaging tool and the test and measurement tool configured to receive image data from the imaging tool, and
   in the event that the received image data satisfies a first alarm condition, trigger the test and measurement tool to perform a first operation corresponding to the first alarm condition, and
   in the event that the received image data satisfies a second alarm condition, trigger the test and measurement tool to perform a second operation, the second alarm condition being different from the first alarm condition and the second operation being different from the first operation and corresponding to the second alarm condition; and wherein
   at least one of the first operation or second operation comprises acquiring measurement data corresponding to the satisfied respective first alarm condition or the second alarm condition via the test and measurement tool.

2. The system of claim 1, wherein the imaging tool comprises the processor.

3. The system of claim 1, wherein the test and measurement tool and the imaging tool are combined into a single apparatus.

4. The system of claim 1, wherein the imaging tool is configured to detect infrared (IR) energy from a target scene and generate IR image data corresponding to the detected IR energy.

5. The system of claim 4, wherein the first alarm condition or the second alarm condition comprises an alarm condition satisfied by detected IR energy from the target scene.

6. The system of claim 4, wherein the processor is further configured to determine the amount of power dissipated as heat from an object under test based on detected IR energy from the target scene, and wherein the first alarm condition or the second alarm condition comprises the determined amount of power dissipated as heat meeting a threshold.

7. The system of claim 1, wherein
   the image data generated by the imaging tool comprises infrared image data;
   the first alarm condition comprises a temperature value meeting an alarm value; and
   the first operation comprises performing a power quality measurement in response to the temperature alarm detected in the image data.

8. The system of claim 1, wherein the one or more operations performed by the test and measurement tool further includes any combination of adjusting the frequency of a measurement, duration of a measurement, or the type of measurement performed by the test and measurement tool.

9. The system of claim 1, further comprising a display configured to display one of both of the image data and the measurement data.

10. The system of claim 9, wherein the display is incorporated into at least one of the imaging tool or the test and measurement tool.

11. The system of claim 9, wherein one or both of the display and the processor are included in an external device separate from the test and measurement tool and the imaging tool.

12. A system including:
   a test and measurement tool configured to generate measurement data including a resistance, a current, and/or a voltage associated with a device under test;
   an imaging tool configured to generate image data; and
   a processor in communication with the imaging tool and the test and measurement tool configured to
   receive measurement data from the test and measurement tool, the received measurement data including a current flowing through a device under test, a voltage drop present in the device under test, or a resistance of a device under test, and
   in the event that the received measurement data satisfies one or more predetermined conditions, trigger the imaging tool to capture at least one image of a target scene and generate image data representative of the target scene, the target scene including the device under test; wherein
   the one or more predetermined conditions comprises the current flowing through a device under test, a voltage drop present in the device under test, or a resistance of a device under test satisfying at least one predetermined condition.

13. The system of claim 12, wherein
the imaging tool is configured to detect infrared (IR) energy from a target scene and generate IR image data corresponding to the detected IR energy.

14. The system of claim 12, wherein the one or more predetermined conditions comprises one or more of:
(i) a resistance, current, or voltage value,
(ii) a change in a resistance, current, or voltage value, or
(iii) a rate of change in a resistance, current, or voltage value meeting a threshold.

15. The system of claim 12, further comprising a display configured to display an image data generated in response to the received measurement data satisfying one or more predetermined conditions and the received measurement data that satisfied the one or more predetermined conditions.

16. The system of claim 12, wherein triggering the imaging tool to generate image data representative of a target scene comprises at least one of: triggering the capturing of a single image, triggering the capture of a plurality of images, triggering the starting of a video recording, or triggering the stopping of a video recording.

17. A system including:
a test and measurement tool configured to generate measurement data, the test and measurement tool being capable of performing a power quality measurement;
an infrared imaging tool configured to generate infrared image data representing a target scene; and
a processor in communication with the imaging tool and the test and measurement tool configured to:
receive infrared image data from the infrared imaging tool; and
in the event that the received infrared image data satisfies a first alarm condition, trigger the test and measurement tool to perform a power quality measurement; wherein
the first alarm condition comprises a temperature in the target scene meeting an alarm condition.

18. The system of claim 17, further comprising a display configured to display one of both of the image data and the measurement data.

19. The system of claim 18, wherein the display is incorporated into at least one of the imaging tool or the test and measurement tool.

20. The system of claim 19, wherein one or both of the display and the processor are included in an external device separate from the test and measurement tool and the imaging tool.

* * * * *